US012652917B2

(12) United States Patent
Shin et al.

(10) Patent No.: US 12,652,917 B2
(45) Date of Patent: Jun. 9, 2026

(54) DISPLAY DEVICE

(71) Applicant: Samsung Display Co., LTD., Yongin-si (KR)

(72) Inventors: Dong Hee Shin, Yongin-si (KR); Sun Kwun Son, Yongin-si (KR); Na Hyeon Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 247 days.

(21) Appl. No.: 18/630,953

(22) Filed: Apr. 9, 2024

(65) Prior Publication Data

US 2025/0081772 A1 Mar. 6, 2025

(30) Foreign Application Priority Data

Aug. 29, 2023 (KR) ........................ 10-2023-0113674

(51) Int. Cl.
| | |
|---|---|
| *G09G 3/32* | (2016.01) |
| *G09G 3/3233* | (2016.01) |
| *H10K 59/131* | (2023.01) |

(52) U.S. Cl.
CPC ......... *H10K 59/131* (2023.02); *G09G 3/3233* (2013.01); *G09G 2300/0426* (2013.01); *G09G 2300/0465* (2013.01); *G09G 2300/0819* (2013.01); *G09G 2300/0842* (2013.01); *G09G 2320/0233* (2013.01); *G09G 2360/14* (2013.01)

(58) Field of Classification Search
CPC .............. H10K 59/131; G09G 3/3233; G09G 2300/0426; G09G 2300/0465; G09G 2300/0819; G09G 2300/0842; G09G 2320/0233; G09G 2360/14; G09G 3/32
See application file for complete search history.

(56) References Cited

U.S. PATENT DOCUMENTS

| | | | |
|---|---|---|---|
| 11,276,743 B2 | 3/2022 | Cho et al. | |
| 2020/0111988 A1* | 4/2020 | Lee | H10K 71/00 |
| 2024/0119889 A1* | 4/2024 | Choi | H01L 25/0753 |
| 2024/0119898 A1* | 4/2024 | Choi | H10K 59/88 |
| 2024/0420633 A1* | 12/2024 | Choi | H10K 59/131 |

* cited by examiner

*Primary Examiner* — Lunyi Lao
*Assistant Examiner* — Jarurat Suteerawongsa
(74) *Attorney, Agent, or Firm* — Womble Bond Dickinson (US) LLP

(57) ABSTRACT

A display device includes a substrate; a circuit layer; and an element layer. The circuit layer includes light emitting pixel drivers; data lines; first auxiliary lines extending in the first direction; second auxiliary lines extending in the second direction; a mesh auxiliary line extending in the second direction, and adjacent to a boundary between a first light emitting pixel driver and a second light emitting pixel driver; a first connection auxiliary electrode in the first light emitting pixel driver, and connected to one second auxiliary line; a second connection auxiliary electrode overlapping the first connection auxiliary electrode, and electrically connected to the first connection auxiliary electrode; a third connection auxiliary electrode connected to one first auxiliary line; and a fourth connection auxiliary electrode overlapping the third connection auxiliary electrode, and electrically connected to the third connection auxiliary electrode.

20 Claims, 25 Drawing Sheets

GL: GWL, GIL, GCL, GBL, GRL

DR3

DL: DL1, DL2, DL3
ASL1: TASL1, VSAHL
ASL2: TASL2, VSAVL
MAL: MAL1, MAL2, MAL3, MAL4

DR3

DR3

DR3

DISPLAY DEVICE

CROSS-REFERENCE TO RELATED APPLICATION

The present application claims priority to and the benefit of Korean Patent Application No. 10-2023-0113674, filed on Aug. 29, 2023, in the Korean Intellectual Property Office, the entire disclosure of which is incorporated herein by reference.

BACKGROUND

1. Field

Aspects of some embodiments of the present disclosure relate to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions.

The display device may be a flat panel display device such as a liquid crystal display device, a field emission display device and a light emitting display device. Examples of the light emitting display device may include an organic light emitting display device including organic light emitting elements, an inorganic light emitting display device including inorganic light emitting elements such as inorganic semiconductors, and a micro light emitting display device including micro light emitting elements.

The organic light emitting display device displays an image using light emitting elements, each including a light emitting layer made of an organic light emitting material. As described above, the organic light emitting display device implements image display using a self-light emitting element, and thus may have relatively superior performance in power consumption, response speed, luminous efficiency, luminance, and wide viewing angle compared to other display devices.

One surface of the display device may be a display surface including a display area in which an image is displayed and a non-display area that is a periphery of the display area. Emission areas emitting light with respective luminances and colors may be arranged in the display area.

The above information disclosed in this Background section is only for enhancement of understanding of the background and therefore the information discussed in this Background section does not necessarily constitute prior art.

SUMMARY

A display device may include light emitting elements respectively located in emission areas, and light emitting pixel drivers respectively electrically connected to the light emitting elements.

The light emitting pixel drivers may supply a driving current corresponding to data signals of the emission areas to the light emitting elements.

However, in order to supply the driving current relatively more uniformly and stably, the light emitting pixel drivers may include not only a driving transistor that generates the driving current, but also transistors for initializing the potential of nodes connected to the driving transistor or the light emitting element. As a result, the display device may include wires that transmit constant voltages for initializing the potentials of the nodes, thereby increasing the width of each of the light emitting pixel drivers, which limits the improvement in resolution.

In view of the above, aspects of the present disclosure provide a display device capable of improving resolution while maintaining the number of wires connected to light emitting pixel drivers.

According to some embodiments of the present disclosure, a display device includes a substrate comprising a display area in which emission areas are arranged and a non-display area around the display area; a circuit layer on the substrate; and an element layer on the circuit layer, and comprising light emitting elements respectively in the emission areas. According to some embodiments, the circuit layer comprises light emitting pixel drivers respectively electrically connected to the light emitting elements, and arranged side by side in a first direction and a second direction; data lines extending in the second direction, and transmitting data signals to the light emitting pixel drivers; first auxiliary lines extending in the first direction; second auxiliary lines extending in the second direction and respectively paired with the data lines; a mesh auxiliary line extending in the second direction, and adjacent to a boundary between a first light emitting pixel driver and a second light emitting pixel driver adjacent in the first direction among the light emitting pixel drivers; a first connection auxiliary electrode in the first light emitting pixel driver, and connected to one second auxiliary line overlapping the first light emitting pixel driver; a second connection auxiliary electrode overlapping the first connection auxiliary electrode, and electrically connected to the first connection auxiliary electrode through a first connection auxiliary contact hole; a third connection auxiliary electrode connected to one first auxiliary line overlapping the first light emitting pixel driver and the second light emitting pixel driver; and a fourth connection auxiliary electrode overlapping the third connection auxiliary electrode, and electrically connected to the third connection auxiliary electrode through a second connection auxiliary contact hole.

According to some embodiments, the circuit layer further comprises a fifth connection auxiliary electrode adjacent to an intersection area between the mesh auxiliary line and the one first auxiliary line, and connected to the mesh auxiliary line; and a sixth connection auxiliary electrode overlapping the fifth connection auxiliary electrode, electrically connected to the fifth connection auxiliary electrode through a third connection auxiliary contact hole, and spaced apart from the second connection auxiliary electrode and the fourth connection auxiliary electrode.

According to some embodiments, the circuit layer further comprises a first anode initialization voltage line extending in the first direction, adjacent to one side of the one first auxiliary line in the second direction, and transmitting a first anode initialization voltage; a second anode initialization voltage line extending in the first direction, adjacent to one side of the first anode initialization voltage line in the second direction, and transmitting a second anode initialization voltage; a seventh connection auxiliary electrode between the first anode initialization voltage line and the second anode initialization voltage line in the second direction in the first light emitting pixel driver, and spaced apart from the first anode initialization voltage line and the second anode initialization voltage line; an eighth connection auxiliary electrode overlapping the seventh connection auxiliary electrode, and electrically connected to the seventh connection auxiliary electrode through a fourth connection auxiliary contact hole; a ninth connection auxiliary electrode between the first anode initialization voltage line and the second anode initialization voltage line in the second direction in the second light emitting pixel driver, and spaced apart from the first anode initialization voltage line and the second anode initialization voltage line; and a tenth connection auxiliary electrode overlapping the ninth connection auxiliary electrode, and electrically connected to the ninth connection auxiliary electrode through a fifth connection auxiliary contact hole. According to some embodiments, the eighth connection auxiliary electrode is adjacent to one side of the mesh auxiliary line in the first direction. According to some embodiments, the tenth connection auxiliary electrode is adjacent to the other side of the mesh auxiliary line in the first direction.

According to some embodiments, the circuit layer further comprises a gate initialization voltage line extending in the first direction, adjacent to the other side of the one first auxiliary line in the second direction, and transmitting a gate initialization voltage; an eleventh connection auxiliary electrode between the gate initialization voltage line and the one first auxiliary line; and a twelfth connection auxiliary electrode overlapping the eleventh connection auxiliary electrode, and electrically connected to the eleventh connection auxiliary electrode through a sixth connection auxiliary contact hole. According to some embodiments, the sixth connection auxiliary electrode and the twelfth connection auxiliary electrode overlap the mesh auxiliary line, and are spaced apart from each other.

According to some embodiments, a bypass area on one side of the display area comprises a bypass middle area at a center, a first bypass side area parallel to the bypass middle area in the first direction and in contact with the non-display area, and a second bypass side area between the bypass middle area and the first bypass side area. According to some embodiments, the data lines comprise a first data line in the first bypass side area and a second data line in the second bypass side area. According to some embodiments, the first auxiliary lines comprise a first bypass auxiliary line electrically connected to the first data line. According to some embodiments, the second auxiliary lines comprise a second bypass auxiliary line paired with the second data line and electrically connected to the first bypass auxiliary line.

According to some embodiments, the first light emitting pixel driver and the second light emitting pixel driver are in the second bypass side area. According to some embodiments, the first light emitting pixel driver is electrically connected to the second data line, and overlaps an intersection area between the first bypass auxiliary line and the second bypass auxiliary line. According to some embodiments, the circuit layer further comprises a first connection auxiliary line connecting the second connection auxiliary electrode to the fourth connection auxiliary electrode. According to some embodiments, the second bypass auxiliary line is electrically connected to the first bypass auxiliary line through the first connection auxiliary electrode, the first connection auxiliary contact hole, the second connection auxiliary electrode, the first connection auxiliary line, the fourth connection auxiliary electrode, the second connection auxiliary contact hole, and the third connection auxiliary electrode.

According to some embodiments, the circuit layer further comprises a second connection auxiliary line connecting the first anode initialization voltage line to the seventh connection auxiliary electrode; and a third connection auxiliary line connecting the sixth connection auxiliary electrode to the eighth connection auxiliary electrode. According to some embodiments, the mesh auxiliary line is electrically connected to the first anode initialization voltage line through the fifth connection auxiliary electrode, the third connection auxiliary contact hole, the sixth connection auxiliary electrode, the third connection auxiliary line, the eighth connection auxiliary electrode, the fourth connection auxiliary contact hole, the seventh connection auxiliary electrode, and the second connection auxiliary line.

According to some embodiments, the circuit layer further comprises a fourth connection auxiliary line connecting the second anode initialization voltage line to the ninth connection auxiliary electrode; and a fifth connection auxiliary line connecting the sixth connection auxiliary electrode to the tenth connection auxiliary electrode. According to some embodiments, the mesh auxiliary line is electrically connected to the second anode initialization voltage line through the fifth connection auxiliary electrode, the third connection auxiliary contact hole, the sixth connection auxiliary electrode, the fifth connection auxiliary line, the tenth connection auxiliary electrode, the fifth connection auxiliary contact hole, the ninth connection auxiliary electrode, and the fourth connection auxiliary line.

According to some embodiments, the circuit layer further comprises a sixth connection auxiliary line connecting the gate initialization voltage line to the eleventh connection auxiliary electrode; and a seventh connection auxiliary line connecting the sixth connection auxiliary electrode to the twelfth connection auxiliary electrode. According to some embodiments, the mesh auxiliary line is electrically connected to the gate initialization voltage line through the fifth connection auxiliary electrode, the third connection auxiliary contact hole, the sixth connection auxiliary electrode, the seventh connection auxiliary line, the twelfth connection auxiliary electrode, the sixth connection auxiliary contact hole, the eleventh connection auxiliary electrode, and the sixth connection auxiliary line.

According to some embodiments, the data lines further comprise a third data line in the bypass middle area. According to some embodiments, the first auxiliary lines further comprise second power auxiliary horizontal lines to which, between a first power and a second power for driving the light emitting elements, the second power is applied. According to some embodiments, the second auxiliary lines further comprise second power auxiliary vertical lines to which the second power is applied. According to some embodiments, the first light emitting pixel driver and the second light emitting pixel driver are in the bypass middle area, and overlap one of the second power auxiliary horizontal lines. According to some embodiments, the first light emitting pixel driver is electrically connected to the third data line. According to some embodiments, the circuit layer further comprises an eighth connection auxiliary line connecting the fourth connection auxiliary electrode to the sixth connection auxiliary electrode. According to some embodiments, the mesh auxiliary line is electrically connected to the one second power auxiliary horizontal line through the fifth connection auxiliary electrode, the third connection auxiliary contact hole, the sixth connection auxiliary electrode, the eighth connection auxiliary line, the fourth connection auxiliary electrode, the second connection auxiliary contact hole, and the third connection auxiliary electrode.

According to some embodiments, the display device further comprises a display driving circuit configured to transmit data signals of the light emitting pixel drivers to the data lines. According to some embodiments, the circuit layer further comprises data supply lines in the non-display area, and electrically connected between the data lines and the display driving circuit. According to some embodiments, among the data supply lines, a first data supply line which transmits the data signal of the first data line is electrically connected to the first data line through the first bypass auxiliary line and the second bypass auxiliary line. According to some embodiments, among the data supply lines, a second data supply line which transmits the data signal of the second data line is directly electrically connected to the second data line. According to some embodiments, among the data supply lines, a third data supply line which transmits the data signal of the third data line is directly electrically connected to the third data line.

According to some embodiments, the third connection auxiliary electrode is in the second light emitting pixel driver.

According to some embodiments, the third connection auxiliary electrode is adjacent to a boundary between the first light emitting pixel driver and the second light emitting pixel driver adjacent in the first direction.

According to some embodiments, the circuit layer further comprises a thirteenth connection auxiliary electrode in the second light emitting pixel driver, and connected to another second auxiliary line overlapping the second light emitting pixel driver; and a fourteenth connection auxiliary electrode overlapping the thirteenth connection auxiliary electrode, and electrically connected to the thirteenth connection auxiliary electrode through a seventh connection auxiliary contact hole.

According to some embodiments of the present disclosure, there is provided a display device comprises a substrate comprising a display area in which emission areas are arranged and a non-display area around the display area; a circuit layer on the substrate; and an element layer on the circuit layer, and comprising light emitting elements respectively in the emission areas. According to some embodiments, the circuit layer comprises light emitting pixel drivers respectively electrically connected to the light emitting elements, and arranged side by side in a first direction and a second direction; data lines extending in the second direction, and transmitting data signals to the light emitting pixel drivers; first auxiliary lines extending in the first direction; second auxiliary lines extending in the second direction and respectively paired with the data lines; mesh auxiliary lines extending in the second direction, and between the second auxiliary lines; a first anode initialization voltage line extending in the first direction, and transmitting a first anode initialization voltage; a second anode initialization voltage line extending in the first direction, and transmitting a second anode initialization voltage; a gate initialization voltage line extending in the first direction, and transmitting a gate initialization voltage; and a first power line transmitting, between a first power and a second power for driving the light emitting elements, the first power. According to some embodiments, the first auxiliary lines comprise a first bypass auxiliary line electrically connected to a first data line adjacent to the non-display area in the first direction among the data lines; and second power auxiliary horizontal lines transmitting the second power. According to some embodiments, the second auxiliary lines comprise a second bypass auxiliary line paired with a second data line spaced farther apart from the non-display area than the first data line in the first direction among the data lines, and electrically connected to the first bypass auxiliary line; and second power auxiliary vertical lines transmitting the second power. According to some embodiments, the light emitting pixel drivers comprise a first light emitting pixel driver comprising an intersection area between the first bypass auxiliary line and the second bypass auxiliary line; and a second light emitting pixel driver adjacent to the first light emitting pixel driver in the first direction. According to some embodiments, the second bypass auxiliary line is electrically connected to the first bypass auxiliary line through a first connection auxiliary electrode connected to the second bypass auxiliary line; a second connection auxiliary electrode overlapping the first connection auxiliary electrode, and electrically connected to the first connection auxiliary electrode through a first connection auxiliary contact hole; a third connection auxiliary electrode connected to the first bypass auxiliary line; a fourth connection auxiliary electrode overlapping the third connection auxiliary electrode, and electrically connected to the third connection auxiliary electrode through a second connection auxiliary contact hole; and a first connection auxiliary line connecting the second connection auxiliary electrode to the fourth connection auxiliary electrode.

According to some embodiments, the mesh auxiliary lines comprise a first mesh auxiliary line electrically connected to the first anode initialization voltage line; a second mesh auxiliary line electrically connected to the second anode initialization voltage line; a third mesh auxiliary line electrically connected to the gate initialization voltage line; and a fourth mesh auxiliary line electrically connected to at least one of the second power auxiliary horizontal lines.

According to some embodiments, the first mesh auxiliary line is adjacent to a boundary between the first light emitting pixel driver and the second light emitting pixel driver. According to some embodiments, the first mesh auxiliary line is electrically connected to the first anode initialization voltage line through a fifth connection auxiliary electrode connected to the first mesh auxiliary line; a sixth connection auxiliary electrode overlapping the fifth connection auxiliary electrode, and electrically connected to the fifth connection auxiliary electrode through a third connection auxiliary contact hole; a seventh connection auxiliary electrode between the first anode initialization voltage line and the second anode initialization voltage line; an eighth connection auxiliary electrode overlapping the seventh connection auxiliary electrode, and electrically connected to the seventh connection auxiliary electrode through a fourth connection auxiliary contact hole; a third connection auxiliary line connecting the first anode initialization voltage line to the seventh connection auxiliary electrode; and a fourth connection auxiliary line connecting the sixth connection auxiliary electrode to the eighth connection auxiliary electrode.

According to some embodiments, the second mesh auxiliary line is adjacent to a boundary between the first light emitting pixel driver and the second light emitting pixel driver. According to some embodiments, the second mesh auxiliary line is electrically connected to the second anode initialization voltage line through a fifth connection auxiliary electrode connected to the first mesh auxiliary line; a sixth connection auxiliary electrode overlapping the fifth connection auxiliary electrode, and electrically connected to the fifth connection auxiliary electrode through a third connection auxiliary contact hole; a ninth connection auxiliary electrode between the first anode initialization voltage line and the second anode initialization voltage line; a tenth connection auxiliary electrode overlapping the ninth connection auxiliary electrode, and electrically connected to the ninth connection auxiliary electrode through a fifth connection auxiliary contact hole; a fourth connection auxiliary line connecting the second anode initialization voltage line to the ninth connection auxiliary electrode; and a fifth connection auxiliary line connecting the sixth connection auxiliary electrode to the tenth connection auxiliary electrode.

According to some embodiments, the third mesh auxiliary line is adjacent to a boundary between the first light emitting pixel driver and the second light emitting pixel driver. According to some embodiments, the third mesh auxiliary line is electrically connected to the gate initialization voltage line through a fifth connection auxiliary electrode connected to the third mesh auxiliary line; a sixth connection auxiliary electrode overlapping the fifth connection auxiliary electrode, and electrically connected to the fifth connection auxiliary electrode through a third connection auxiliary contact hole; an eleventh connection auxiliary electrode between the gate initialization voltage line and the sixth connection auxiliary electrode; a twelfth connection auxiliary electrode overlapping the eleventh connection auxiliary electrode, and electrically connected to the eleventh connection auxiliary electrode through a sixth connection auxiliary contact hole; a sixth connection auxiliary line connecting the gate initialization voltage line to the eleventh connection auxiliary electrode; and a seventh connection auxiliary line connecting the sixth connection auxiliary electrode to the twelfth connection auxiliary electrode.

According to some embodiments, the light emitting pixel drivers further comprise a third light emitting pixel driver comprising an intersection area between one of the second power auxiliary horizontal lines and one of the second power auxiliary vertical lines; and a fourth light emitting pixel driver adjacent to the third light emitting pixel driver in the first direction, and comprising an intersection area between the one second power auxiliary horizontal line and another one of the second power auxiliary vertical lines. According to some embodiments, the third connection auxiliary electrode is connected to the one second power auxiliary horizontal line. According to some embodiments, the fourth mesh auxiliary line is adjacent to a boundary between the third light emitting pixel driver and the fourth light emitting pixel driver. According to some embodiments, the fourth mesh auxiliary line is electrically connected to the one second power auxiliary horizontal line through a fifth connection auxiliary electrode connected to the fourth mesh auxiliary line; a sixth connection auxiliary electrode overlapping the fifth connection auxiliary electrode, and electrically connected to the fifth connection auxiliary electrode through a third connection auxiliary contact hole; the third connection auxiliary electrode; the fourth connection auxiliary electrode; and an eighth connection auxiliary line connecting the fourth connection auxiliary electrode to the sixth connection auxiliary electrode.

According to some embodiments, the display device includes a substrate, a circuit layer on the substrate, and an element layer on the circuit layer. According to some embodiments, the substrate includes a display area in which emission areas are arranged, and a non-display area around the display area. According to some embodiments, the element layer includes light emitting elements respectively in the emission areas. According to some embodiments, the circuit layer includes light emitting pixel drivers respectively electrically connected to the light emitting elements and arranged side by side in first and second directions, data lines extending in the second direction and transmitting data signals to the light emitting pixel drivers, first auxiliary lines extending in the first direction, second auxiliary lines extending in the second direction and respectively paired with the data lines, a mesh auxiliary line extending in the second direction and adjacent to a boundary between a first light emitting pixel driver and a second light emitting pixel driver adjacent in the first direction among the light emitting pixel drivers, a first connection auxiliary electrode in the first light emitting pixel driver and connected to one second auxiliary line overlapping the first light emitting pixel driver, a second connection auxiliary electrode electrically connected to the first connection auxiliary electrode through a first connection auxiliary contact hole, a third connection auxiliary electrode in the second light emitting pixel driver and connected to one first auxiliary line overlapping the first and second light emitting pixel drivers, and a fourth connection auxiliary electrode electrically connected to the third connection auxiliary electrode through a second connection auxiliary contact hole.

As such, according to some embodiments, the third connection auxiliary electrode connected to one first auxiliary line overlapping the first and second light emitting pixel drivers is only in the second light emitting pixel driver among the first and second light emitting pixel drivers. Accordingly, the width of each of the light emitting pixel drivers may be relatively reduced, which may lead to an improvement in resolution.

According to some embodiments, the first auxiliary lines may include a first bypass auxiliary line electrically connected to a first data line in a first bypass side area that is in contact with the non-display area in the first direction. According to some embodiments, the second auxiliary lines may include a second bypass auxiliary line that is paired with a second data line in a second bypass side area between a bypass middle area and the first bypass side area in the first direction and electrically connected to the first bypass auxiliary line.

According to some embodiments, the first light emitting pixel driver may be electrically connected to the second data line and may overlap an intersection area between the first bypass auxiliary line and the second bypass auxiliary line. In this case, the second connection auxiliary electrode may be connected to the fourth connection auxiliary electrode through a first connection auxiliary line. Here, the second connection auxiliary electrode may be connected to the second bypass auxiliary line through the first connection auxiliary electrode and the first connection auxiliary contact hole, and the fourth connection auxiliary electrode may be connected to the first bypass auxiliary line through the third connection auxiliary electrode and the second connection auxiliary contact hole, so that the second bypass auxiliary line may be electrically connected to the first bypass auxiliary line through the first connection auxiliary line.

That is, even if the third connection auxiliary electrode connected to the first bypass auxiliary line is not in the first light emitting pixel driver, electrical connection between the first bypass auxiliary line and the second bypass auxiliary line may be achieved through the first connection auxiliary line.

According to some embodiments, the circuit layer may further include a fifth connection auxiliary electrode connected to the mesh auxiliary line, and a sixth connection auxiliary electrode electrically connected to the fifth connection auxiliary electrode through a third connection auxiliary contact hole.

According to some embodiments, the circuit layer may further include a seventh connection auxiliary electrode between a first anode initialization voltage line and a second anode initialization voltage line in the first light emitting pixel driver, an eighth connection auxiliary electrode electrically connected to the seventh connection auxiliary electrode through a fourth connection auxiliary contact hole, a ninth connection auxiliary electrode between the first anode initialization voltage line and the second anode initialization voltage line in the second light emitting pixel driver, and a tenth connection auxiliary electrode electrically connected to the ninth connection auxiliary electrode through a fifth connection auxiliary contact hole.

According to some embodiments, when the mesh auxiliary line between the first light emitting pixel driver and the second light emitting pixel driver transmits a first anode initialization voltage, the mesh auxiliary line may be electrically connected to the first anode initialization voltage line through a second connection auxiliary line that connects the first anode initialization voltage line to the seventh connection auxiliary electrode, and a third connection auxiliary line that connects the sixth connection auxiliary electrode to the eighth connection auxiliary electrode.

According to some embodiments, when the mesh auxiliary line between the first light emitting pixel driver and the second light emitting pixel driver transmits a second anode initialization voltage, the mesh auxiliary line may be electrically connected to the second anode initialization voltage line through a fourth connection auxiliary line that connects the second anode initialization voltage line to the ninth connection auxiliary electrode, and a fifth connection auxiliary line that connects the sixth connection auxiliary electrode to the tenth connection auxiliary electrode.

According to some embodiments, the circuit layer may further include an eleventh connection auxiliary electrode between a gate initialization voltage line and one first auxiliary line, and a twelfth connection auxiliary electrode electrically connected to the eleventh connection auxiliary electrode through a sixth connection auxiliary contact hole.

According to some embodiments, when the mesh auxiliary line between the first light emitting pixel driver and the second light emitting pixel driver transmits a gate initialization voltage, the mesh auxiliary line may be electrically connected to the gate initialization voltage line through a sixth connection auxiliary line that connects the gate initialization voltage line to the eleventh connection auxiliary electrode, and a seventh connection auxiliary line that connects the sixth connection auxiliary electrode to the twelfth connection auxiliary electrode.

In this way, even if the sixth connection auxiliary electrode electrically connected to the mesh auxiliary line through the fifth connection auxiliary electrode and the third connection auxiliary contact hole is not in each of the first and second light emitting pixel drivers, electrical connection between the mesh auxiliary line and any one of the first anode initialization voltage line, the second anode initialization voltage line, and the gate initialization voltage line may be achieved.

As a result, the width of each of the light emitting pixel drivers may be further reduced, which may improve resolution.

According to some embodiments, the circuit layer may further include a thirteenth connection auxiliary electrode in the second light emitting pixel driver and connected to another second auxiliary line overlapping the second light emitting pixel driver, and a fourteenth connection auxiliary electrode electrically connected to the thirteenth connection auxiliary electrode through a seventh connection auxiliary contact hole.

In this way, the first connection auxiliary electrode and the thirteenth connection auxiliary electrode may be in the first light emitting pixel driver and the second light emitting pixel driver, respectively, so that the first light emitting pixel driver and the second light emitting pixel driver may be mutually symmetrical with respect to the boundary between the first light emitting pixel driver and the second light emitting pixel driver.

As a result, variation in optical characteristics caused by the first light emitting pixel driver and variation in optical characteristics caused by the second light emitting pixel driver may become similar to each other, and thus display quality may be relatively improved.

However, the characteristics of embodiments of according to the present disclosure are not limited to those described above and various other characteristics are incorporated herein.

BRIEF DESCRIPTION OF THE DRAWINGS

The above and other aspects and features of embodiments according to the present disclosure will become more apparent by describing in more detail aspects of some embodiments thereof with reference to the attached drawings, in which.

DETAILED DESCRIPTION

Figure 1:
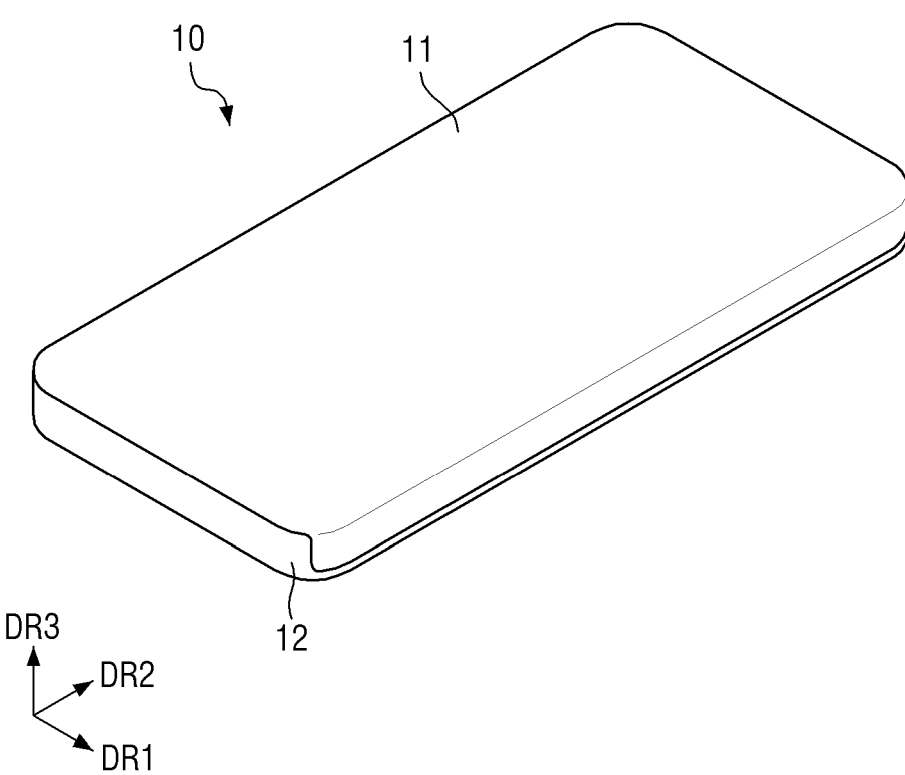
FIG. 1 is a perspective view showing an electronic device according to some embodiments.

Aspects of some embodiments of the present disclosure will now be described more fully hereinafter with reference to the accompanying drawings. The embodiments may, however, be provided in different forms and should not be construed as limiting. The same reference numbers indicate the same components throughout the present disclosure. In the accompanying figures, the thickness of layers and regions may be exaggerated for clarity.

Some of the parts that are not associated with the description may not be provided in order to describe aspects of some embodiments of the present disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and/or vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the spirit and scope of the present disclosure herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean A, B, or A and B, or any combination of A and/or B.

Unless otherwise defined or implied, all terms used herein (including technical and scientific terms) have the same meaning as commonly understood by those skilled in the art to which the present disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, aspects of some embodiments will be described in more detail with reference to the accompanying drawings.

Figure 2:
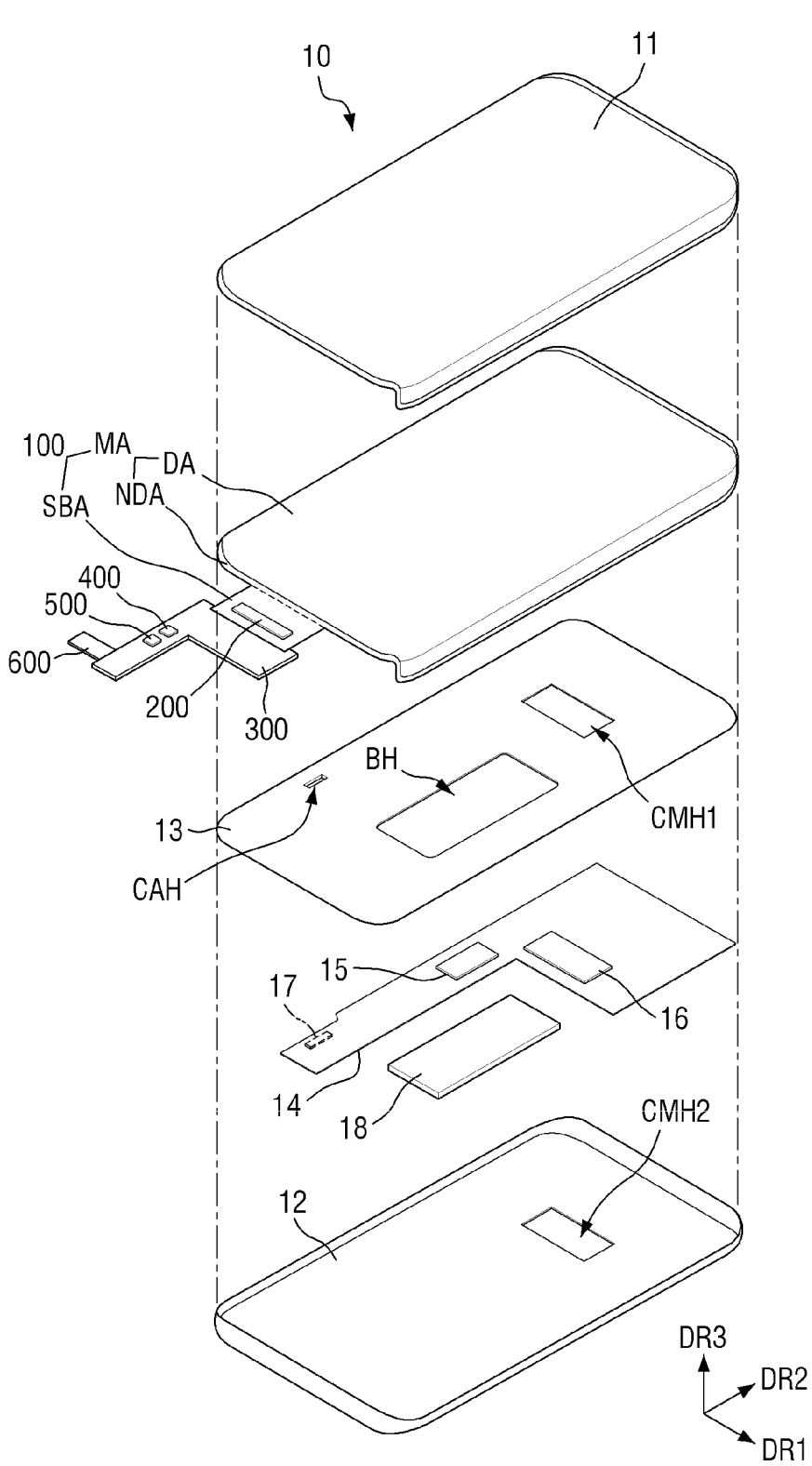
FIG. 2 is an exploded perspective view of the electronic device shown in FIG. 1 according to some embodiments.

FIG. 1 is a perspective view showing an electronic device according to some embodiments. FIG. 2 is an exploded perspective view of the electronic device shown in FIG. 1.

Referring to FIG. 1, an electronic device 10 according to some embodiments is a device having a function of displaying images in a display area. The electronic device 10 may provide portability. For example, the electronic device 10 may be a portable electronic device such as a mobile phone, a smartphone, a tablet personal computer (PC), a smart watch, a watch phone, a mobile communication terminal, an electronic notebook, an electronic book, a portable multimedia player (PMP), a navigation device and an ultramobile PC (UMPC).

However, the electronic device 10 according to some embodiments is not limited to a portable electronic device, and may be a large-sized device such as a television, a laptop computer, a monitor, a billboard, and an Internet-of-Things (IoT) device.

The electronic device 10 according to some embodiments may include a cover window 11 and a lower cover 12, which are provided as a housing to protect a display device 100 (see FIG. 2).

Referring to FIG. 2, the electronic device 10 may further include the display device 100, a bracket 13, and a main circuit board 14, which are accommodated between the cover window 11 and the lower cover 12.

The display device 100 may include a main region MA including a display area DA where an image is displayed and a non-display area NDA around the display area DA, and a sub-region SBA protruding from one side of the main region MA.

The display device 100 may further include a display driving circuit 200 located in the sub-region SBA, a display circuit board 300 bonded to one side of the sub-region SBA, a touch driving circuit 400 and a scanning driving circuit 500 mounted on the display circuit board 300, and a cable 600 extending from one side of the display circuit board 300.

In the present specification, a first direction DR1 may be a direction parallel to a short side of the electronic device 10 in a plan view, that is, a horizontal direction of the electronic device 10. A second direction DR2 may be a direction parallel to a long side of the electronic device 10 in a plan view, that is, a vertical direction of the electronic device 10. A third direction DR3 may be a thickness direction of the electronic device 10.

The electronic device 10 may have a shape close to a rectangular shape in plan view. For example, the electronic device 10 may have a rectangular shape, in plan view, having a short side in the first direction DR1 and a long side in the second direction DR2. A corner where the short side in the first direction DR1 and the long side in the second direction DR2 meet may be right-angled or rounded with a curvature (e.g., a set or predetermined curvature). The planar shape of the electronic device 10 is not limited to the rectangular shape, and may be formed in another polygonal shape, a circular shape or an elliptical shape.

The cover window 11 may be located on the display device 100 to cover the top surface of the display device 100. The cover window 11 may serve to protect the top surface of the display device 100.

The cover window 11 may include a light transmitting portion that is transparent and a light blocking portion that is opaque.

The light transmitting portion may overlap the display area DA of the display device 100 in the third direction DR3, and the light blocking portion may overlap the non-display area NDA of the display device 100 in the third direction DR3.

The cover window 11 may include a top surface portion forming the top surface of the electronic device 10, a left surface portion forming the left side surface of the electronic device 10, and a right surface portion forming the right side surface of the electronic device 10. The left surface portion of the cover window 11 may extend from the left side of the top surface portion, and the right surface portion thereof may extend from the right side of the top surface portion.

Each of the top, left, and right surface portions of the cover window 11 may include the light transmitting portion and the light blocking portion.

The light transmitting portion of the cover window 11 may be located on most of each of the top, left, and right surface portions of the cover window 11.

The light blocking portion of the cover window 11 may be located at the upper edge and lower edge of the top surface portion of the cover window 11, the upper edge, left edge, and lower edge of the left surface portion of the cover window 11, and the upper edge, right edge, and lower edge of the right surface portion of the cover window 11.

The display device 100 may be located below the cover window 11.

That is, the cover window 11 may be located on the display device 100.

The display device 100 may include the main region MA serving as a display surface and the sub-region SBA protruding from one side of the main region MA.

The main region MA may include the display area DA configured to display images and the non-display area NDA that is a peripheral area of the display area DA.

The display area DA may be located in most of the main region MA. The display area DA may be located at the center of the main region MA.

The non-display area NDA may be located outside (e.g., in a periphery or outside a footprint of) the display area DA. The non-display area NDA may be an edge area of the main region MA.

The sub-region SBA may protrude from one side of the main region MA in the second direction DR2.

The length of the sub-region SBA in the first direction DR1 may be less than or equal to the length of the main region MA in the first direction DR1. The length of the sub-region SBA in the second direction DR2 may be less than the length of the main region MA in the second direction DR2, but is not limited thereto.

Because a part of the sub-region SBA is transformed to be bent, another part of the sub-region SBA may overlap the main region MA in the third direction DR3.

The display driving circuit 200 may be arranged in the sub-region SBA.

The display device 100 may include a top surface portion facing the top surface portion of the cover window 11, a left surface portion facing the left surface portion of the cover window 11, and a right surface portion facing the right surface portion of the cover window 11. The left surface portion of the display device 100 may extend from the left side of the top surface portion, and the right surface portion of the display device 100 may extend from the right side of the top surface portion.

Each of the top, left, and right surface portions of the display device 100 may include the display area DA and the non-display area NDA.

The display area DA may be located on most of each of the top, left, and right surface portions of the display device 100.

The non-display area NDA may be located at the upper edge and lower edge of the top surface portion of the display device 100, the upper edge, left edge, and lower edge of the left surface portion of the display device 100, and the upper edge, right edge, and lower edge of the right surface portion of the display device 100.

The display driving circuit 200 may be mounted on the sub-region SBA of the display device 100, and the display circuit board 300 may be attached thereto.

One end of the display circuit board 300 may be attached onto pads located on the lower edge of the sub-region SBA of the display device 100 by using an anisotropic conductive film.

The display circuit board 300 may be a flexible printed circuit board (FPCB) which is bendable, a rigid printed circuit board (PCB) which maintains a flat shape, or a composite printed circuit board having both of the rigid printed circuit board and the flexible printed circuit board.

Figure 7:
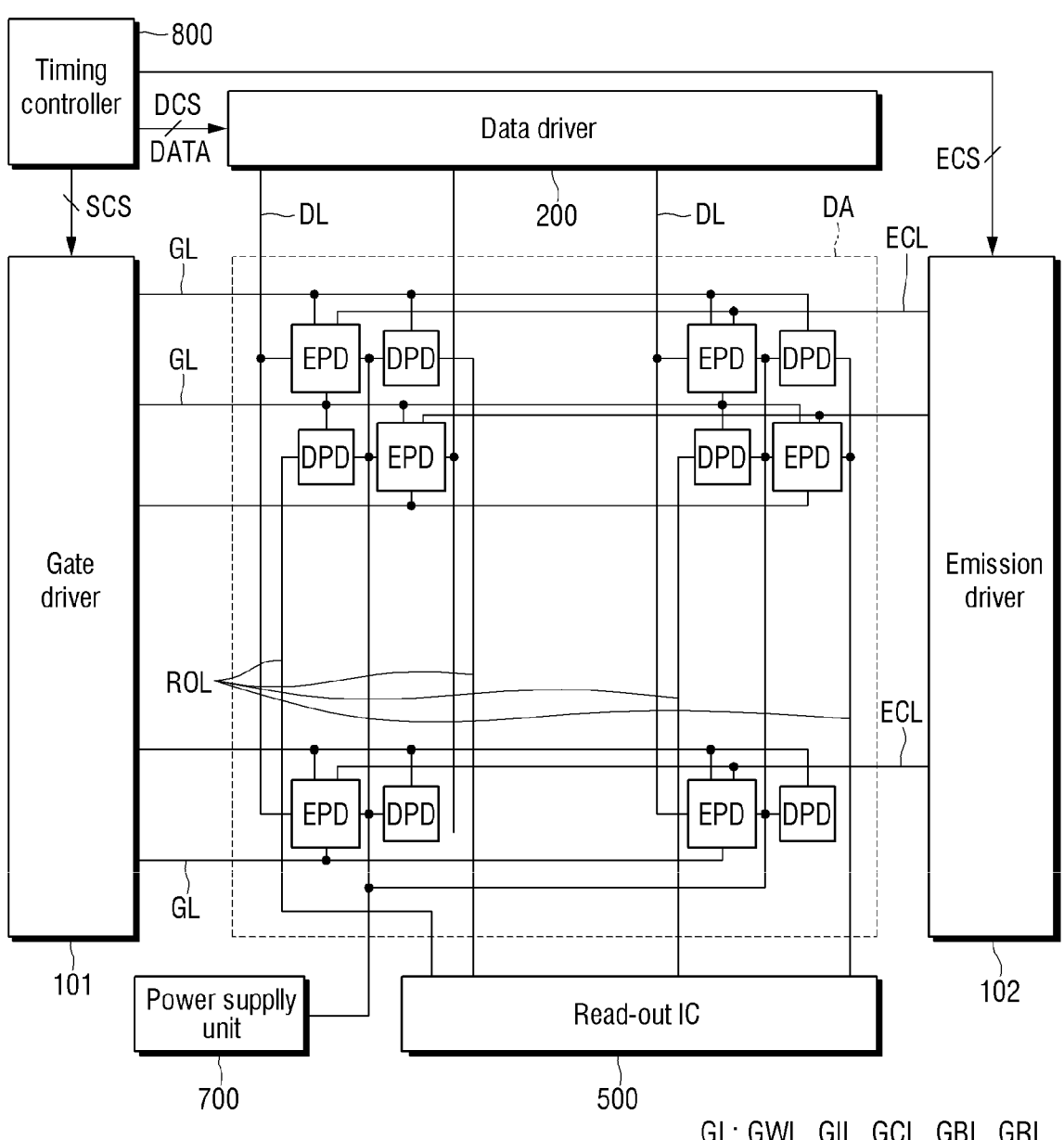
FIG. 7 is a block diagram showing a circuit layer of FIG. 4 according to some embodiments.

Based on control signals and power voltages supplied from the display circuit board 300, the display driving circuit 200 may transmit data signals Vdata (see FIG. 8) of light emitting pixel drivers EPD (see FIG. 7) of the display area DA to data lines DL (see FIG. 7).

The display driving circuit 200 may be provided as an integrated circuit (IC) and mounted on the sub-region SBA of the display device 100 by a chip on glass (COG) method, a chip on plastic (COP) method, or an ultrasonic method. However, this is only an example, and embodiments according to the present disclosure are not limited thereto. For example, the display driving circuit 200 may be mounted on the display circuit board 300.

According to some embodiments, the touch driving circuit 400 and the scanning driving circuit 500 may be further mounted in the sub-region SBA of the display device 100.

Alternatively, as shown in FIG. 2, the touch driving circuit 400 and the scanning driving circuit 500 may be mounted on the display circuit board 300.

The touch driving circuit 400 may be electrically connected to a touch sensor layer 150 (see FIG. 4) of the display device 100.

The scanning driving circuit 500 may be electrically connected to light sensing elements PD (see FIG. 8) through light sensing pixel drivers DPD (see FIG. 7) and read-out lines ROL (see FIG. 7) of the display area DA.

The bracket 13 may be located under the display device 100.

The bracket 13 may include plastic, metal, or both plastic and metal. The bracket 13 may include a first camera hole CMH1 into which a camera device 16 is inserted, a battery hole BH into which a battery 18 is located, and a cable hole CAH through which the cable 600 connected to the display circuit board 300 passes.

The main circuit board 14 and the battery 18 may be located under the bracket 13. The main circuit board 14 may be a printed circuit board or a flexible printed circuit board.

The main circuit board 14 may include a main processor 15, the camera device 16, and a main connector 17. The main processor 15 may be formed as an integrated circuit.

The camera device 16 may be located on both the top surface and the bottom surface of the main circuit board 14, the main processor 15 may be located on the top surface of the main circuit board 14, and the main connector 17 may be located on the bottom surface of the main circuit board 14.

The main processor 15 may control all functions of the electronic device 10.

For example, the main processor 15 may output digital video data to the display driving circuit 200 through the display circuit board 300 such that the display device 100 displays an image. In addition, the main processor 15 may receive touch data including user's touch coordinates from the touch driving circuit 400, determine whether or not the user has touched or approached, and then perform an operation corresponding to the user's touch input or approach input. For example, the main processor 15 may perform an operation or execute an application indicated by an icon touched by the user.

In addition, the main processor 15 may receive scanning data from the scanning driving circuit 500, and perform an operation or execute an application based on whether or not the scanning data is valid.

The main processor 15 may be an application processor formed of an integrated circuit, a central processing unit, or a system chip.

The camera device 16 may process an image frame of a still image or video obtained by an image sensor in a camera mode and output it to the main processor 15.

The cable 600 having passed through the cable hole CAH of the bracket 13 may be connected to the main connector 17. Thus, the main circuit board 14 may be electrically connected to the display circuit board 300.

The battery 18 may be arranged so as not to overlap the main circuit board 14 in the third direction DR3. The battery 18 may overlap the battery hole BH of the bracket 13 in the third direction DR3.

In addition, the main circuit board 14 may be further equipped with a mobile communication module capable of transmitting and receiving radio signals with at least one of a base station, an external terminal, or a server in a mobile communication network. The radio signal may include various types of data according to transmission and reception of a voice signal, a video call signal, or a text/multimedia message.

The lower cover 12 may be located below the main circuit board 14 and the battery 18. The lower cover 12 may be fixed by being fastened to the bracket 13. The lower cover 12 may form the upper side surface, lower side surface, and bottom surface of the electronic device 10. The lower cover 12 may include plastic, metal, or both plastic and metal.

The lower cover 12 may include a second camera hole CMH2 through which the bottom surface of the camera device 16 is exposed. The position of the camera device 16 and the positions of the first and second camera holes CMH1 and CMH2 corresponding to the camera device 16 are not limited to the embodiments illustrated with respect to FIG. 2.

Next, the display device 100 according to some embodiments will be described.

Figure 3:
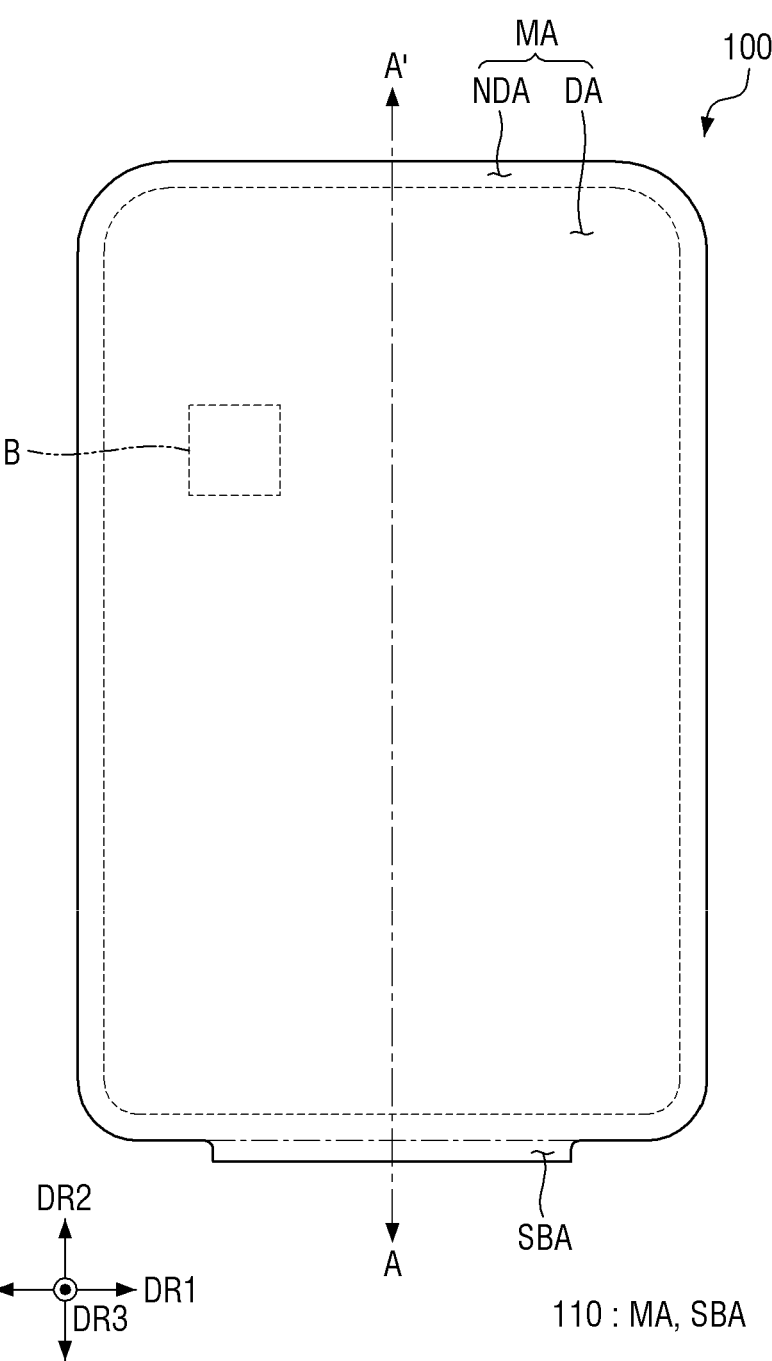
FIG. 3 is a plan view illustrating the display device of FIG. 2 according to some embodiments.
Figure 4:
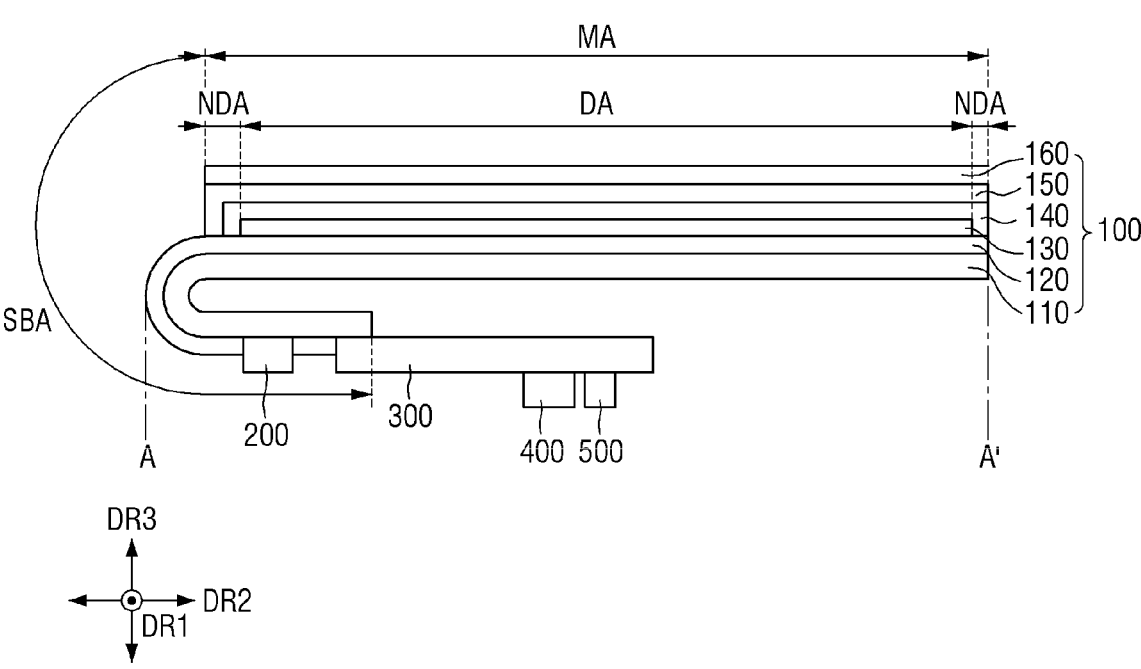
FIG. 4 is a cross-sectional view taken along the line A-A' of FIG. 3 according to some embodiments.
Figure 5:
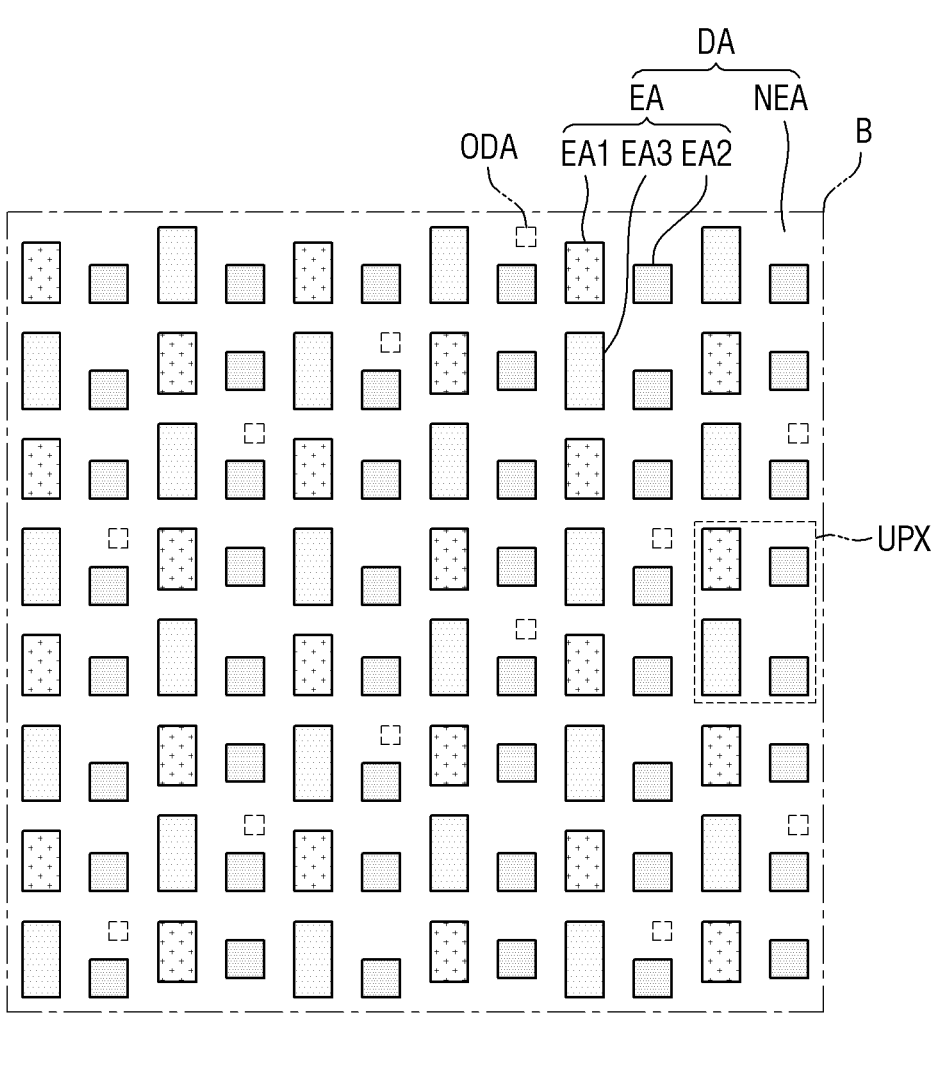
FIG. 5 is a layout diagram illustrating part B of FIG. 3 according to some embodiments.
Figure 5:
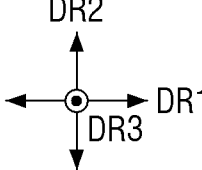

FIG. 3 is a plan view illustrating the display device of FIG. 2. FIG. 4 is a cross-sectional view taken along the line A-A' of FIG. 3. FIG. 5 is a layout diagram illustrating part B of FIG. 3.

FIGS. 3 and 4 illustrate the display device 100 with a part of the sub-region SBA in a bent state.

The display device 100 may be a light emitting display device such as an organic light emitting display using an organic light emitting diode, a quantum dot light emitting display including a quantum dot light emitting layer, an inorganic light emitting display including an inorganic semiconductor, and a micro light emitting display using a micro or nano light emitting diode (LED). In the following description, it is assumed that the display device 100 is an organic light emitting display device. However, the present disclosure is not limited thereto, and may be applied to a display device including an organic insulating material, an organic light emitting material, and a metal material.

The display device 100 may be formed to be flat, but embodiments according to the present disclosure are not limited thereto. For example, the display device 100 may include a curved portion formed at left and right ends and having a constant curvature or a varying curvature. In addition, the display device 100 may be formed flexibly so that it can be curved, bent, folded, or rolled.

Referring to FIG. 3, at least one surface of the display device 100 includes the main region MA from which light for displaying an image is emitted.

The display area DA may, in plan view, be formed in a rectangular shape having short sides in the first direction DR1 and long sides in the second direction DR2 crossing the first direction DR1. The corner where the short side in the first direction DR1 and the long side in the second direction DR2 meet may be rounded to have a curvature (e.g., a set or predetermined curvature) or may be right-angled. The planar shape of the display area DA is not limited to the rectangular shape, and may be formed in another polygonal shape, a circular shape or an elliptical shape.

The display area DA may occupy most of the main region MA. The display area DA may be located at the center of the main region MA.

Referring to FIG. 4, the display device 100 further includes the sub-region SBA protruding from one side of the main region MA.

The sub-region SBA may be a region protruding from the non-display area NDA of the main region MA to one side in the second direction DR2.

Because a part of the sub-region SBA is transformed to be bent, another part of the sub-region SBA may be located on the rear surface of the display device 100.

The display device 100 according to some embodiments includes a substrate 110, a circuit layer 120 located on the substrate 110, and an element layer 130 located on the circuit layer 120.

According to some embodiments, the display device 100 may further include an encapsulation layer 140 located on the element layer 130, and the touch sensor layer 150 located on the encapsulation layer 140. In addition, the display device 100 may further include a polarization layer 160 located on the touch sensor layer 150, in order to reduce reflection of external light.

The substrate 110 may include the main region MA corresponding to the display surface, and the sub-region SBA protruding from one side of the main region MA in the second direction DR2.

The main region MA of the substrate 110 may include the display area DA which is most of the center, and the non-display area NDA which is the periphery of the display area DA.

The sub-region SBA may protrude from one side of the main region MA in the second direction DR2.

Referring to FIG. 5, the display area DA includes emission areas EA, a non-emission area NEA which is a separation region between the emission areas EA, and light sensing areas ODA located in parts of the non-emission area NEA.

Each of the emission areas EA may be a unit that emits light in a wavelength band corresponding to one color of two or more different colors with a luminance corresponding to an image signal.

Each of the emission areas EA may have a rhombus planar shape or a rectangular planar shape. However, this is only an example, and the planar shape of the emission areas EA according to some embodiments is not limited to that illustrated in FIG. 5. That is, the emission areas EA may have a polygonal shape such as a rhombus shape or a hexagonal shape other than a rectangular shape, a circular shape, or an elliptical shape in a plan view.

The emission areas EA may include a first emission area EA1 emitting light of a first color having a wavelength band (e.g., a set or predetermined wavelength band), a second emission area EA2 emitting light of a second color having a wavelength band lower than that of the first color, and a third emission area EA3 emitting light of a third color having a wavelength band lower than that of the second color.

For example, the first color may be red having a wavelength band in a range of 600 nanometers (nm) (or approximately 600 nm) to 750 nm (or approximately 750 nm), the second color may be green having a wavelength band in a range of 480 nm (or approximately 480 nm) to 560 nm (or approximately 560 nm), and the third color may be blue having a wavelength band in a range of 370 nm (or approximately 370 nm) to 460 nm (or approximately 460 nm). However, this is only an example, and the wavelength bands of the first color, the second color, and the third color according to some embodiments are not limited thereto.

Because the emission areas EA include the first emission area EA1, the second emission area EA2, and the third emission area EA3, each of unit pixels UPX may be provided by a combination of one or more first emission areas EA1, one or more second emission areas EA2, and one or more third emission areas EA3 adjacent to each other among the emission areas EA.

Each of the unit pixels UPX may be a unit for displaying various colors including white. That is, lights of various colors displayed by the unit pixels UPX may be implemented as a mixture of lights emitted from two or more emission areas EA included in each unit pixel UPX.

In a case where the first color of the first emission area EA1, the second color of the second emission area EA2, and the third color of the third emission area EA3 are red, green, and blue, respectively, the third emission area EA3 may have a larger width than the first emission area EA1, and the second emission area EA2 may have a smaller width than the first emission area EA1. However, this is merely an example, and the width of each of the emission areas EA is not limited to that illustrated in FIG. 5.

Further, the first emission area EA1 and the third emission area EA3 may be alternately arranged in the second direction DR2. In addition, the second emission area EA2 may be arranged side by side in the second direction DR2 and may be located between the first emission area EA1 and the third emission area EA3 in the first direction DR1.

In this case, each of the unit pixels UPX may include one first emission area EA1 and one third emission area EA3 adjacent to each other in the second direction DR2, and two second emission areas EA2 adjacent thereto in the first direction DR1. However, this is only an example, and the arrangement pattern of the emission areas EA and the components of the unit pixel UPX according to some embodiments are not limited to those illustrated in FIG. 5.

According to some embodiments, the display area DA includes the light sensing areas ODA located in parts of the non-emission area NEA.

For example, the light sensing areas ODA may be located between the second emission areas EA2 having a relatively small width, in the second direction DR2. One or more emission areas EA may be located between the light sensing areas ODA in each of the first and second directions DR1 and DR2.

As shown in FIG. 4, according to some embodiments, the element layer 130 includes light emitting elements LE (see FIG. 8) respectively located in the emission areas EA, and the light sensing elements PD (see FIG. 8) respectively arranged in the light sensing areas ODA.

According to some embodiments, the circuit layer 120 may include the light emitting pixel drivers EPD (see FIG. 7) respectively electrically connected to the light emitting elements LE of the element layer 130, the light sensing pixel drivers DPD (see FIG. 7) respectively electrically connected to the light sensing elements PD of the element layer 130, the data lines DL (see FIG. 7) electrically connected to the light emitting pixel drivers EPD, and the read-out lines ROL (see FIG. 7) electrically connected to the light sensing pixel drivers DPD.

The encapsulation layer 140 may cover the element layer 130 and may extend into the non-display area NDA to be contact with the circuit layer 120. The encapsulation layer 140 may include a structure in which two or more inorganic layers and at least one organic layer are alternately stacked.

The touch sensor layer 150 may be located on the encapsulation layer 140 and may correspond to the main region MA. The touch sensor layer 150 may include touch electrodes for sensing a touch of a person or an object.

The polarization layer 160 blocks external light reflected from the touch sensor layer 150, the encapsulation layer 140, the element layer 130, and the circuit layer 120, and the interfaces thereof, and this is to prevent the deterioration of visibility of an image due to external light reflection.

Meanwhile, as a part of the sub-region SBA is transformed into a bending shape, the display driving circuit 200 mounted in the sub-region SBA, and the display circuit board 300 connected to one side of the sub-region SBA may be located under the substrate 110.

The display driving circuit 200 may be electrically connected to the data lines DL of the circuit layer 120. The display driving circuit 200 may transmit the data signals of the light emitting pixel drivers EPD to the data lines DL based on control signals and power voltages supplied from the display circuit board 300.

The display driving circuit 200 may be provided as an integrated circuit (IC) and mounted on the sub-region SBA of the display device 100 by a chip on glass (COG) method, a chip on plastic (COP) method, or an ultrasonic method. However, this is only an example, and embodiments are not limited thereto. For example, the display driving circuit 200 may be mounted on the display circuit board 300.

One end of the display circuit board 300 may be attached onto pads located on one edge of the sub-region SBA of the display device 100 by using an anisotropic conductive film.

The display circuit board 300 may be a flexible printed circuit board (FPCB) which is bendable, a rigid printed circuit board (PCB) which maintains a flat shape, or a composite printed circuit board having both of the rigid printed circuit board and the flexible printed circuit board.

The display circuit board 300 may be connected to signal pads SPD (see FIG. 10) located on one side of the sub-region SBA.

The touch driving circuit 400 and the scanning driving circuit 500 may be mounted on the display circuit board 300.

The touch driving circuit 400 may be electrically connected to the touch sensor layer 150 of the display device 100.

The touch driving circuit 400 may apply a touch driving signal to driving lines of the touch sensor layer 150, and receive a touch sensing signal from sensing lines. Further, the touch driving circuit 400 may detect charge variation amounts of capacitances based on the touch sensing signal, thereby determining whether a user has touched or approached. The user's touch means that an object such as a pen or a user's finger is in direct contact with the top surface of the cover window located on the touch sensor layer. The user's approach means that the object such as the pen or the user's finger hovers over the top surface of the cover window. The touch driving circuit 400 may output touch data including the user's touch coordinates to the main processor 15.

The scanning driving circuit 500 may be electrically connected to the read-out lines ROL of the circuit layer 120.

The scanning driving circuit 500 may collect light sensing signals of the light sensing elements PD located in the light sensing areas ODA of the main region MA through the light sensing pixel drivers DPD and the read-out lines ROL. Further, based on the collected light sensing signals, the scanning driving circuit 500 may output, to the main processor 15, scanning data about the shape of an object in contact with a screen by detecting differences in the amount of light reflected by the object in contact with the screen.

Figure 6:
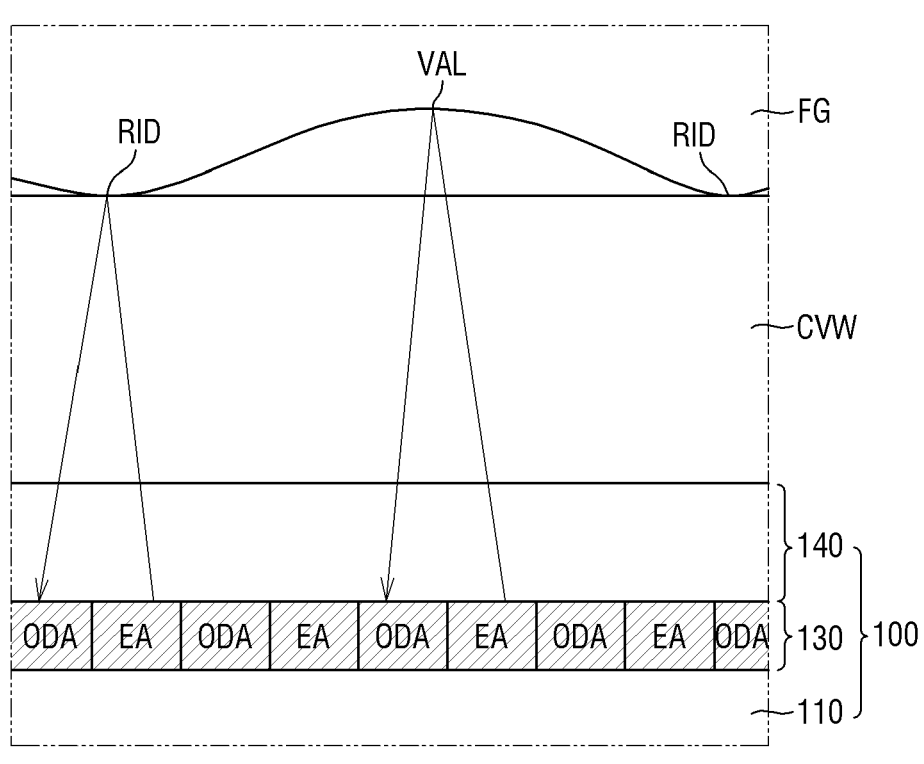
FIG. 6 is an diagram illustrating a scanning function by the light sensing areas shown in FIG. 5 according to some embodiments.
Figure 6:

FIG. 6 is a diagram illustrating a scanning function by the light sensing areas shown in FIG. 5.

Referring to FIG. 6, the display device 100 according to some embodiments may include the light sensing elements PD located in the light sensing areas ODA, and thus may provide a scanning function to detect the shape of an object in contact with the screen.

The fingerprint of a user's finger FG in contact with the cover window 11 includes ridges RID and valleys VAL between the ridges RID. The ridges RID in the fingerprint are in contact with the cover window 11. However, the valleys VAL in the fingerprint are spaced apart from the cover window 11. That is, the top surface of the cover window 11 facing the valleys VAL is in contact with air.

Light emitted from the emission areas EA may be reflected by the user's finger FG in contact with the cover window 11 and detected by the light sensing elements PD of the light sensing areas ODA. However, because the refractive index of the finger FG is different from that of the air, the amount of light reflected from the ridge RID may be different from the amount of light reflected from the valley VAL.

Accordingly, based on the difference in the amount of light incident on the light sensing elements PD, the ridge RID and the valley VAL of the fingerprint FG may be derived, so that the fingerprint FG pattern of the finger may be detected.

FIG. 7 is a block diagram showing a circuit layer of FIG. 4.

Referring to FIG. 7, the circuit layer 120 of the display device 100 according to some embodiments may include the light emitting pixel drivers EPD respectively corresponding to the emission areas EA of the display area DA, the light sensing pixel drivers DPD respectively corresponding to the light sensing areas ODA of the display area DA, the data lines DL electrically connected to the light emitting pixel drivers EPD, and the read-out lines ROL electrically connected to the light sensing pixel drivers DPD.

The display device 100 according to some embodiments may include the display driving circuit 200 that transmits the data signals Vdata (see FIG. 8) of the light emitting pixel drivers EPD to the data lines DL, and the scanning driving circuit 500 that collects the light sensing signals of the light sensing pixel drivers DPD through the read-out lines ROL.

The display device 100 according to some embodiments may further include a gate driving circuit 101 that supplies one or more gate signals to the light emitting pixel drivers EPD and the light sensing pixel drivers DPD, an emission control circuit 102 that supplies emission control signals EC (see FIG. 8) to the light emitting pixel drivers EPD, a power supply unit 700 that supplies various power and voltages to the light emitting pixel drivers EPD and the light sensing pixel drivers DPD, and a timing controller 800 that controls a drive timing.

The timing controller 800 receives an image signal supplied from the outside of the display device 100. The timing controller 800 may output image data DATA and a data control signal DCS to the display driving circuit 200. In addition, the timing controller 800 may generate a scan control signal SCS for controlling the operation timing of the gate driving circuit 101, and an emission control driving signal ECS for controlling the operation timing of the emission control circuit 102. For example, the timing controller 800 may generate the scan control signal SCS and the emission control driving signal ECS, output the scan control signal SCS to the gate driving circuit 101 through a scan control line, and output the emission control driving signal ECS to the emission control circuit 102 through an emission control driving line.

The display driving circuit 200 may convert the image data DATA into analog data voltages and output them to the data lines DL.

The gate driving circuit 101 may generate gate signals in response to the scan control signal SCS and sequentially output the gate signals to gate lines GL. The gate lines GL may include a scan write line GWL (see FIG. 8) for transmitting a scan write signal GW (see FIG. 8), a scan initialization line GIL (see FIG. 8) for transmitting a scan initialization signal GI (see FIG. 8), a gate control line GCL (see FIG. 8) for transmitting a gate control signal GC (see FIG. 8), a bias control line GBL (see FIG. 8) for transmitting a bias control signal GB (see FIG. 8), and a reset control line GRL (see FIG. 8) for transmitting a reset control signal GR (see FIG. 8).

The emission control circuit 102 may sequentially output the emission control signals EC (see FIG. 8) to the emission control lines ECL in response to the emission control driving signal ECS. The emission control signals EC of the emission control circuit 102 may have pulses of a first level voltage or a second level voltage. Meanwhile, the emission control circuit 102 may not be provided separately from the gate driving circuit 101 and may be incorporated into the gate driving circuit 101.

The power supply unit 700 may supply various types of power required to drive the light emitting pixel drivers EPD and the light sensing pixel drivers DPD.

For example, the power supply unit 700 may supply a first power ELVDD (see FIG. 8) and a second power ELVSS (see FIG. 8) for driving the light emitting elements LE, and a gate initialization voltage VGINT (see FIG. 8) and an anode initialization voltage VAINT (see FIG. 8) for initializing the light emitting pixel drivers EPD.

In addition, the power supply unit 700 may further supply a reset voltage VRST (see FIG. 8) for resetting the light sensing pixel drivers DPD.

The scanning driving circuit 500 may be electrically connected to the light sensing elements PD through the read-out lines ROL and the light sensing pixel drivers DPD.

Each of the light sensing elements PD may generate a photocurrent corresponding to the amount of light incident on the light sensing element PD, and the scanning driving circuit 500 may detect the shape of a user's fingerprint based on the photocurrent of each of the light sensing elements PD.

The scanning driving circuit 500 may generate scanning data depending on the magnitude of photocurrent detected by the light sensing elements PD and transmit it to the main processor, and the main processor 15 may compare the scanning data with reference data and execute an application based on whether the scanning data matches the user's fingerprint.

Figure 8:
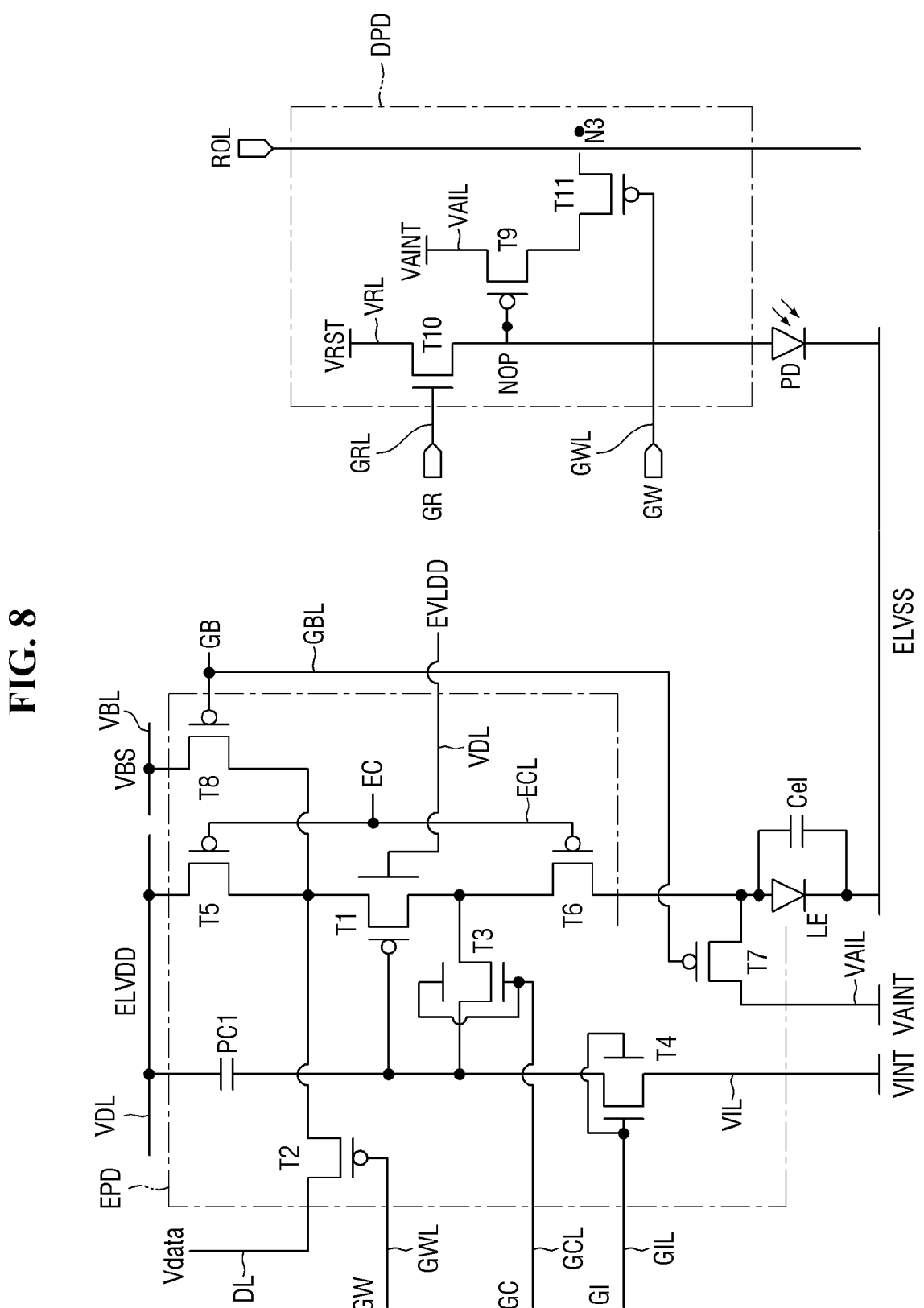
FIG. 8 is an equivalent circuit diagram of the light emitting pixel driver and the light sensing pixel driver shown in FIG. 7 according to some embodiments.

FIG. 8 is an equivalent circuit diagram of the light emitting pixel driver and the light sensing pixel driver shown in FIG. 7.

Referring to FIG. 8, one of the light emitting elements LE of the element layer 130 may be electrically connected between one of the light emitting pixel drivers EPD of the circuit layer 120 and the second power ELVSS.

That is, an anode electrode 131 (see FIG. 9) of the light emitting element LE may be electrically connected to the light emitting pixel driver EPD, and a cathode electrode 134 (see FIG. 9) of the light emitting element LE may be applied with the second power ELVSS having a lower voltage level than the first power ELVDD.

A capacitor Cel connected in parallel with the light emitting element LE refers to a parasitic capacitance between the anode electrode 131 and the cathode electrode 134.

The circuit layer 120 may further include a first power line VDL for transmitting the first power ELVDD, a gate initialization voltage line VGIL for transmitting the gate initialization voltage VGINT, an anode initialization voltage line VAIL for transmitting the anode initialization voltage VAINT, and a bias power line VBL for transmitting a bias power VBS.

The circuit layer 120 may further include a scan write line GWL for transmitting a scan write signal GW, a scan initialization line GIL for transmitting a scan initialization signal GI, an emission control line ECL for transmitting an emission control signal EC, a gate control line GCL for transmitting a gate control signal GC, and a bias control line GBL for transmitting a bias control signal GB.

One light emitting pixel driver EPD of the circuit layer 120 may include a first transistor T1 configured to generate a driving current for driving the light emitting element LE, two or more transistors T2 to T8 electrically connected to the first transistor T1, and at least one capacitor PC1.

The first transistor T1 is connected in series with the light emitting element LE between the first power ELVDD and the second power ELVSS.

That is, the first electrode (e.g., the source electrode) of the first transistor T1 may be electrically connected to the first power line VDL through the fifth transistor T5. Further, the second electrode (e.g., the drain electrode) of the first transistor T1 may be electrically connected to the anode electrode 131 of the light emitting element LE through the sixth transistor T6.

The first electrode of the first transistor T1 may be electrically connected to the data line DL through the second transistor T2.

The gate electrode of the first transistor T1 may be electrically connected to the first power line VDL through the first capacitor PC1. That is, the first capacitor PC1 may be electrically connected between the gate electrode of the first transistor T1 and the first power line VDL.

Accordingly, the potential of the gate electrode of the first transistor T1 may be maintained by the first power ELVDD of the first power line VDL.

Further, when the data signal Vdata of the data line DL is transmitted to the first electrode of the first transistor T1 through the turned-on second transistor T2, the voltage difference corresponding to the data signal Vdata and the first power ELVDD may be generated between the gate electrode of the first transistor T1 and the first electrode of the first transistor T1.

In this case, when the voltage difference between the gate electrode of the first transistor T1 and the first electrode of the first transistor T1, i.e., the gate-to-source voltage difference becomes equal to or greater than a threshold voltage, the first transistor T1 may be turned on, thereby generating a drain-to-source current of the first transistor T1 corresponding to the data signal Vdata.

Then, when the fifth transistor T5 and the sixth transistor T6 are turned on, the first transistor T1 may be connected in series with the light emitting element LE between the first power line VDL and the second power line VSL. Accordingly, the drain-to-source current of the first transistor T1 corresponding to the data signal Vdata may be supplied as a driving current of the light emitting element LE.

Accordingly, the light emitting element LE may emit light having a luminance corresponding to the data signal Vdata.

The second transistor T2 may be electrically connected between the first electrode of the first transistor T1 and the data line DL. The second transistor T2 may be turned on by the scan write signal GW of the scan write line GWL.

The third transistor T3 may be electrically connected between the gate electrode of the first transistor T1 and the second electrode of the first transistor T1. The third transistor T3 may be turned on by the gate control signal GC of the gate control line GCL.

The fourth transistor T4 may be connected between the gate electrode of the first transistor T1 and the gate initialization voltage line VGIL. The fourth transistor T4 may be turned on by the scan initialization signal GI of the scan initialization line GIL.

The third transistor T3 and the fourth transistor T4 may be provided as N-type MOSFETs.

The fifth transistor T5 may be electrically connected between the first electrode of the first transistor T1 and the first power line VDL.

The sixth transistor T6 may be electrically connected between the second electrode of the first transistor T1 and the anode electrode 131 of the light emitting element LE.

The fifth transistor T5 and the sixth transistor T6 may be turned on by the emission control signal EC of the light emission control line ECL.

The seventh transistor T7 may be electrically connected between the anode electrode of the light emitting element LE and the anode initialization voltage line VAIL. The seventh transistor T7 may be turned on by the bias control signal GB of the bias control line GBL.

The eighth transistor T8 may be connected between the first electrode of the first transistor T1 and the bias power line VBL.

The eighth transistor T8 may be turned on by the bias control signal GB of the bias control line GBL.

Among the first to eighth transistors T1 to T8, the transistors T1, T2, and T5 to T8 other than the third and fourth transistor T3 and T4 may be provided as P-type MOSFETS.

In addition, one of the light sensing elements PD of the element layer 130 may be electrically connected between an element output node NOP of one of the light sensing pixel drivers DPD of the circuit layer 120 and the second power ELVSS.

The circuit layer 120 may further include the reset control line GRL for transmitting the reset control signal GR for initiating a reset of the light sensing pixel drivers DPD, a reset voltage line VRL for transmitting the reset voltage VRST for resetting the light sensing pixel drivers DPD, and the read-out line ROL electrically connecting the light sensing pixel drivers DPD to the scanning driving circuit 500.

Each of the light sensing pixel drivers DPD may include at least one transistor T9, T10, T11.

The light sensing element PD may be a photoelectric conversion element that converts incident light into an electrical signal by generating a photocurrent corresponding to the amount of the incident light, and outputs a light sensing signal.

The light sensing element PD may be a photodiode including a sensing anode electrode, a sensing cathode electrode, and a photoelectric conversion layer located between the sensing anode electrode and the sensing cathode electrode.

The light sensing element PD may be a phototransistor or an inorganic photodiode formed of a p-n type or p-i-n type inorganic material. Alternatively, the photoelectric conversion element PD may also be an organic photodiode including an electron donating material generating donor ions and an electron accepting material generating acceptor ions.

When light is incident on the light sensing element PD, the photoelectric conversion layer may react to the incident light to generate photocharges, and the photocharges generated in the photoelectric conversion layer may move, thereby generating a photocurrent between the sensing anode electrode and the sensing cathode electrode.

As one example, photocharges generated in the photoelectric conversion layer by light incident on the light sensing element PD may be accumulated in the sensing anode electrode. In addition, the potential of the element output node NOP electrically connected to the sensing anode electrode may be increased by the photocharges accumulated in the sensing anode electrode. When the light sensing element PD and the read-out line ROL are connected to the element output node NOP by the turn-on of ninth and eleventh transistors T9 and T11, a sensing voltage may be accumulated at a node N3 between the read-out line ROL and the eleventh transistor T11 in proportion to the voltage of the element output node NOP where charges are accumulated.

The ninth transistor T9 may include a gate electrode electrically connected to the element output node NOP, and may be electrically connected between the anode initialization voltage line VAIL and the eleventh transistor T11.

The ninth transistor T9 may be a source follower amplifier that generates a source-drain current in proportion to the amount of electric charges of the element output node NOP inputted to the gate electrode thereof.

That is, when the potential of the element output node NOP is increased by the photocharges accumulated in the light sensing element PD, and the difference voltage between the anode initialization voltage VAINT and the potential of the element output node NOP becomes equal to or greater than the threshold voltage of the ninth transistor T9, the ninth transistor T9 may be turned on. In this case, a light sensing signal corresponding to the difference voltage between the anode initialization voltage VAINT and the potential of the element output node NOP may be generated by the turned-on ninth transistor T9.

Meanwhile, although FIG. 8 illustrates that the first electrode of the ninth transistor T9 is connected to the anode initialization voltage line VAIL, embodiments are not limited to the illustration of FIG. 8. That is, the first electrode of the ninth transistor T9 may be connected to one of the first power line VDL and the gate initialization voltage line VGIL, rather than anode initialization voltage line VAIL.

The tenth transistor T10 may be electrically connected between the element output node NOP and the reset voltage line VRL, and may be turned on by the reset control signal GR of the reset control line GRL. Accordingly, when the tenth transistor T10 is turned on by the reset control signal GR, the potential of the element output node NOP may be reset to the reset voltage VRST of the reset voltage line VRL.

The eleventh transistor T11 may be electrically connected between the second electrode of the ninth transistor T9 and the read-out line ROL, and may be turned on by the scan write signal GW of the scan write line GWL. Accordingly, the source-drain current, i.e., the light sensing signal, of the ninth transistor T9 may be transmitted to the read-out line ROL through the eleventh transistor T11 turned on by the scan write signal GW.

The ninth transistor T9 and the eleventh transistor T11 may be provided as P-type MOSFETs, and the tenth transistor T10 may be provided as an N-type MOSFET.

Figure 9:
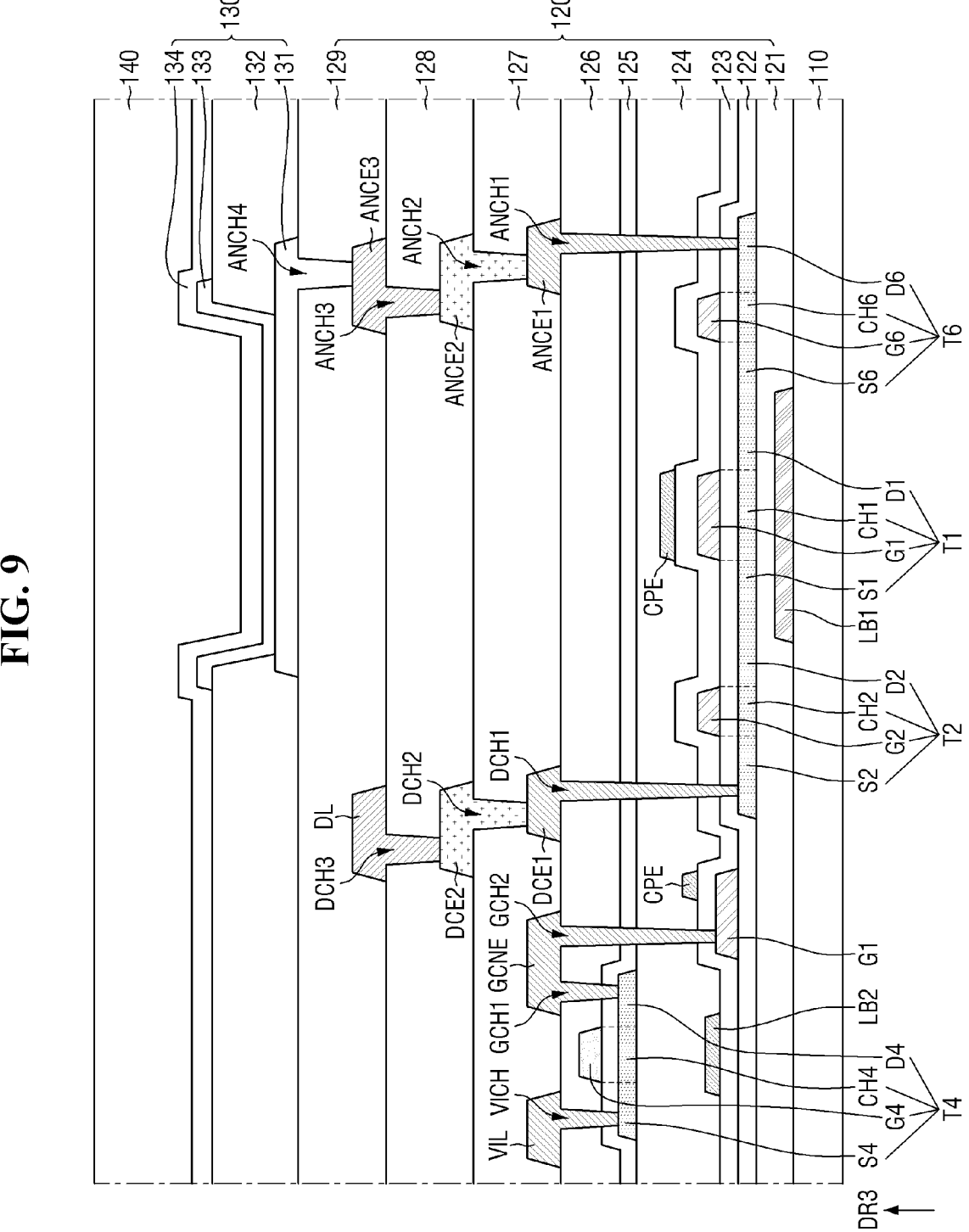
FIG. 9 is a cross-sectional view illustrating a first transistor, a second transistor, a fourth transistor, a sixth transistor, and one light emitting element of FIG. 8 according to some embodiments.

FIG. 9 is a cross-sectional view illustrating a first transistor, a second transistor, a fourth transistor, a sixth transistor, and one light emitting element of FIG. 8.

Referring to FIG. 9, the circuit layer 120 of the display device 100 according to some embodiments may include a buffer layer 121 that covers a first light blocking layer LB1 on the substrate 110, a first semiconductor layer CH1, S1, D1, CH2, S2, D2, CH6, S6, and D6 located on the buffer layer 121, a first gate insulating layer 122 that covers the first semiconductor layer CH1, S1, D1, CH2, S2, D2, CH6, S6, and D6, a first gate conductive layer G1, G2, and G6 located on the first gate insulating layer 122, a second gate insulating layer 123 that covers the first gate conductive layer G1, G2, and G6, a second gate conductive layer CPE and LB2 located on the second gate insulating layer 123, a first interlayer insulating layer 124 that covers the second gate conductive layer CPE and LB2, a second semiconductor layer CH4, S4, and D4 located on the first interlayer insulating layer 124, a third gate insulating layer 125 that covers the second semiconductor layer CH4, S4, and D4, a third gate conductive layer G4 located on the third gate insulating layer 125, a second interlayer insulating layer 126 that covers the third gate conductive layer G4, a first source/drain conductive layer ANCE1, DCE1, GCNE, and VGIL located on the second interlayer insulating layer 126, a first planarization layer 127 that covers the first source/drain conductive layer ANCE1, DCE1, GCNE, and VGIL, a second source/drain conductive layer ANCE2 and DCE2 located on the first planarization layer 127, a second planarization layer 128 that covers the second source/drain conductive layer ANCE2 and DCE2, and a third source/drain conductive layer ANCE3 and DL located on the second planarization layer 128.

The first transistor T1 may include the channel portion CH1, the source portion S1, and the drain portion D1 formed of the first semiconductor layer on the buffer layer 121, and the gate electrode G1 located on the first gate insulating layer 122 and overlapping the channel portion CH1.

The channel portion CH1 of the first transistor T1 may overlap the first light blocking layer LB1 on the substrate 110.

The second transistor T2 may include the channel portion CH2, the source portion S2, and the drain portion D2 formed of the first semiconductor layer on the buffer layer 121, and the gate electrode G2 located on the first gate insulating layer 122 and overlapping the channel portion CH2.

The sixth transistor T6 may include the channel portion CH6, the source portion S6, and the drain portion D6 formed of the first semiconductor layer on the buffer layer 121, and the gate electrode G6 located on the first gate insulating layer 122 and overlapping the channel portion CH6.

The source portion S2 of the second transistor T2 may be electrically connected to the data line DL through a first data connection electrode DCE1 and a second data connection electrode DCE2.

The first data connection electrode DCE1 may be located on the second interlayer insulating layer 126, and may be electrically connected to the source portion S2 of the second transistor T2 through a first data contact hole DCH1 penetrating the second interlayer insulating layer 126, the third gate insulating layer 125, the first interlayer insulating layer 124, the second gate insulating layer 123, and the first gate insulating layer 122.

The second data connection electrode DCE2 may be located on the first planarization layer 127, and may be electrically connected to the first data connection electrode DCE1 through a second data contact hole DCH2 penetrating the first planarization layer 127.

The data line DL may be located on the second planarization layer 128, and may be electrically connected to the second data connection electrode DCE2 through a third data contact hole DCH3 penetrating the second planarization layer 128.

The drain portion D2 of the second transistor T2 may be connected to the source portion S1 of the first transistor T1.

The drain portion D1 of the first transistor T1 may be connected to the source portion S6 of the sixth transistor T6.

The drain portion D6 of the sixth transistor T6 may be electrically connected to the anode electrode 131 through a first anode connection electrode ANCE1, a second anode connection electrode ANCE2, and a third anode connection electrode ANCE3.

The first anode connection electrode ANCE1 may be located on the second interlayer insulating layer 126, and may be electrically connected to the drain portion D6 of the sixth transistor T6 through a first anode contact hole ANCH1 penetrating the second interlayer insulating layer 126, the third gate insulating layer 125, the first interlayer insulating layer 124, the second gate insulating layer 123, and the first gate insulating layer 122.

The second anode connection electrode ANCE2 may be located on the first planarization layer 127, and may be electrically connected to the first anode connection electrode ANCE1 through a second anode contact hole ANCH2 penetrating the first planarization layer 127.

The third anode connection electrode ANCE3 may be located on the second planarization layer 128, and may be electrically connected to the second anode connection electrode ANCE2 through a third anode contact hole ANCH3 penetrating the second planarization layer 128.

The anode electrode 131 may be located on a third planarization layer 129, and may be electrically connected to the third anode connection electrode ANCE3 through a fourth anode contact hole ANCH4 penetrating the third planarization layer 129.

The first capacitor PC1 may be provided by an overlapping region between a capacitor electrode CPE located on the second gate insulating layer 123 and the gate electrode G1 of the first transistor T1.

The fourth transistor T4 may include a channel portion CH4, a source portion S4, and a drain portion D4 formed of the second semiconductor layer on the first interlayer insulating layer 124, and a gate electrode G4 located on the third gate insulating layer 125 and overlapping the channel portion CH4.

The channel portion CH4 of the fourth transistor T4 may overlap a second light blocking layer LB2 on the second gate insulating layer 123.

The source portion S4 of the fourth transistor T4 may be electrically connected to the gate initialization voltage line VGIL on the second interlayer insulating layer 126 through a hole penetrating the second interlayer insulating layer 126 and the third gate insulating layer 125.

The drain portion D4 of the fourth transistor T4 may be electrically connected to the gate electrode G1 of the first transistor T1 through a gate connection electrode GCNE on the second interlayer insulating layer 126.

The gate connection electrode GCNE may be electrically connected to the drain portion D4 of the fourth transistor T4 through a first gate contact hole GCH1 penetrating the second interlayer insulating layer 126 and the third gate insulating layer 125.

The gate connection electrode GCNE may be electrically connected to the gate electrode G1 of the first transistor T1 through a second gate contact hole GCH2 penetrating the second interlayer insulating layer 126, the third gate insulating layer 125, the first interlayer insulating layer 124, and the second gate insulating layer 123.

Meanwhile, because the third transistor T3 and the tenth transistor T10 are similar in structure to the fourth transistor T4, and the fifth transistor T5, the seventh transistor T7, the ninth transistor T9, and the eleventh transistor T11 are similar in structure to the second transistor T2 and the sixth transistor T6, some redundant description of the same or similar elements may be omitted below.

In addition, the circuit layer 120 of the display device 100 according to some embodiments may further include a wire electrically connected between some of the data lines DL and the display driving circuit 200 and located in the display area DA, and a wire electrically connected between some of the read-out lines ROL and the scanning driving circuit 500 and located in the display area DA, in order to reduce the width of the non-display area NDA.

Figure 10:
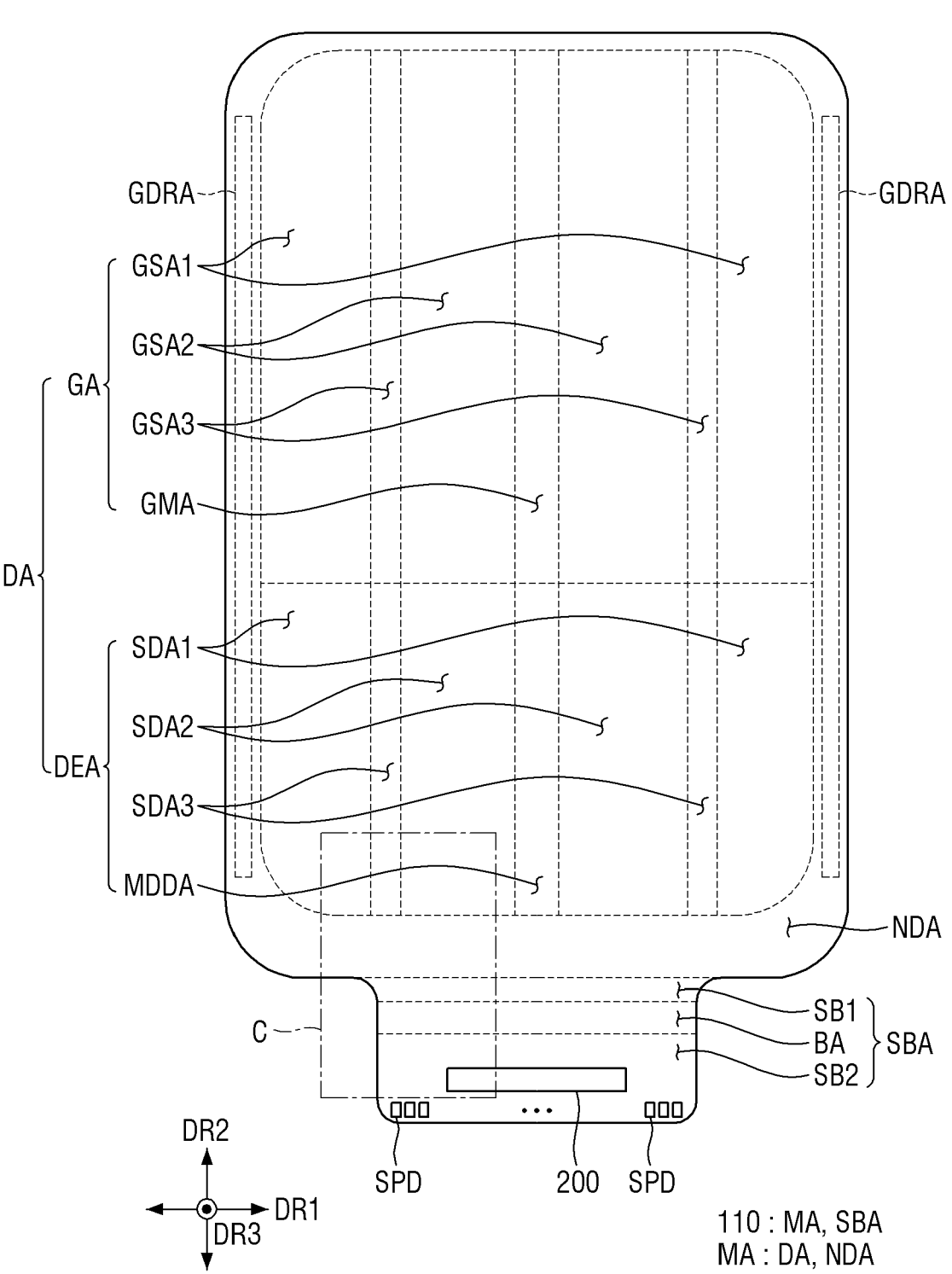
FIG. 10 is a plan view illustrating the substrate of FIG. 2 according to some embodiments.

FIG. 10 is a plan view illustrating the substrate of FIG. 2 according to some embodiments.

Referring to FIG. 10, the substrate 110 of the display device 100 according to some embodiments may include the main region MA corresponding to the display surface, and the sub-region SBA protruding from one side of the main region MA.

The main region MA may include the display area DA located in the center of the substrate 110, and the non-display area NDA located at the edge of the display device 100 to surround (e.g., in a periphery or outside a footprint of) the display area DA.

The display area DA may include a bypass area DEA located on one side adjacent to the sub-region SBA, and a general area GA located in the remaining area excluding the bypass area DEA.

The bypass area DEA may include a bypass middle area MDDA located at the center in the first direction DR1, a first bypass side area SDA1 parallel to the bypass middle area MDDA in the first direction DR1 and in contact with the non-display area NDA, a second bypass side area SDA2 located between the bypass middle area MDDA and the first bypass side area SDA1, and a third bypass side area SDA3 located between the first bypass side area SDA1 and the second bypass side area SDA2.

The first bypass side area SDA1 may be located closer to the bent corner of the substrate 110 than the bypass middle area MDDA, the second bypass side area SDA2, and the third bypass side area SDA3.

The first bypass side area SDA1, the third bypass side area SDA3, and the second bypass side area SDA2 may be located between each of both sides of the bypass middle area MDDA in the first direction DR1 and the non-display area NDA.

The general area GA may include a general middle area GMA connected to the bypass middle area MDDA of the bypass area DEA in the second direction DR2, a first general side area GSA1 connected to the first bypass side area SDA1 in the second direction DR2, a second general side area GSA2 connected to the second bypass side area SDA2 in the second direction DR2, and a third general side area GSA3 connected to the third bypass side area SDA3 in the second direction DR2.

The non-display area NDA may include a gate driving circuit area GDRA in which the gate driving circuit 101 and the emission control circuit 102 are located.

The gate driving circuit area GDRA may be located in a portion of the non-display area NDA adjacent to at least one side of the display area DA in the first direction DR1.

The sub-region SBA may include a bending region BA that is transformed into a bending shape, a first sub-region SB1 located between one side of the bending region BA and the main region MA, and a second sub-region SB2 connected to the other side of the bending region BA.

When the bending region BA is transformed into a bending shape, the second sub-region SB2 is located below the substrate 110 and overlaps the main region MA.

The display driving circuit 200 may be located in the second sub-region SB2.

The signal pads SPD bonded to the circuit board 300 may be located at one edge of the second sub-region SB2.

Figure 11:
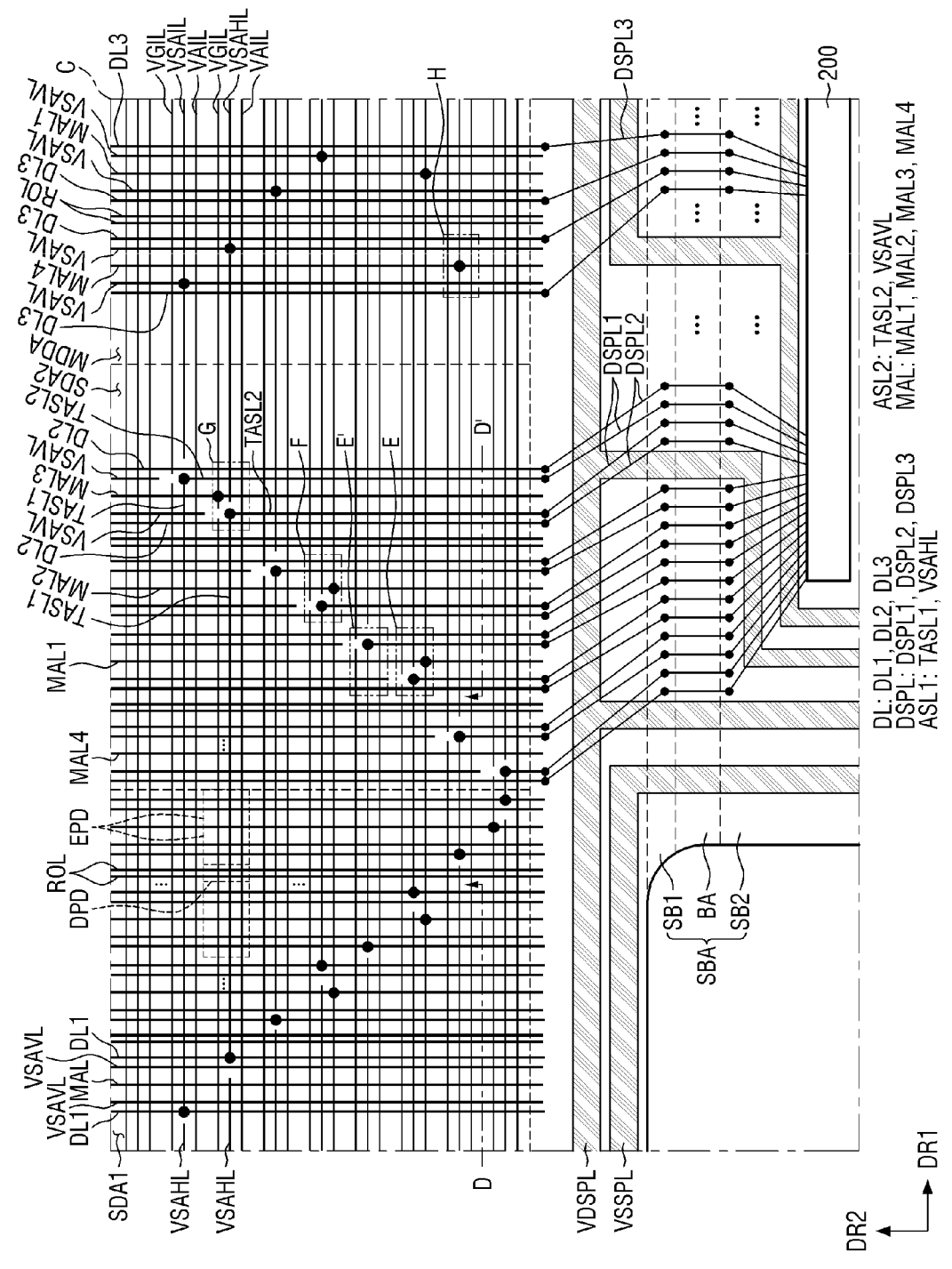
FIG. 11 is a layout diagram illustrating part C of FIG. 10.
Figure 12:
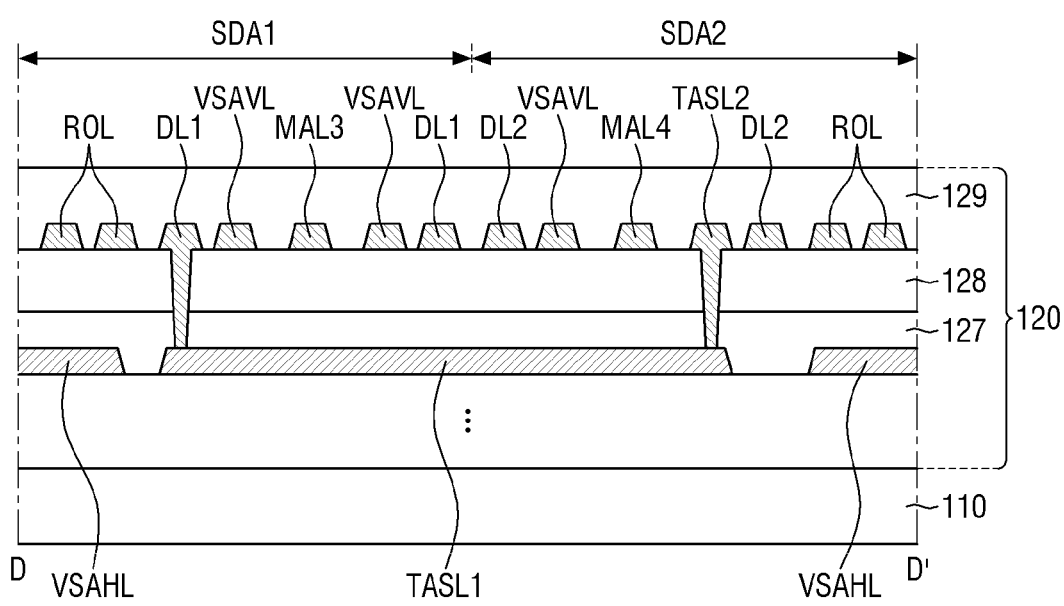
FIG. 12 is a cross-sectional view taken along the line D-D' of FIG. 11.

FIG. 11 is a layout diagram illustrating part C of FIG. 10. FIG. 12 is a cross-sectional view taken along line D-D' of FIG. 11.

Referring to FIG. 11, the circuit layer 120 of the display device 100 according to some embodiments may include the light emitting pixel drivers EPD respectively electrically connected to the light emitting elements LE of the element layer 130 and arranged side by side in the first and second directions DR1 and DR2, the data lines DL extending in the second direction DR2 and transmitting the data signal Vdata to the light emitting pixel drivers EPD, first auxiliary lines ASL1 extending in the first direction DR1, second auxiliary lines ASL2 extending in the second direction DR2 and respectively paired with the data lines DL, and mesh auxiliary lines MAL extending in the second direction DR2.

According to some embodiments, the circuit layer 120 may further include the light sensing pixel drivers DPD respectively electrically connected to the light sensing elements PD of the element layer 130, and the read-out lines ROL extending in the second direction DR2 and electrically connected to the light sensing pixel drivers DPD to transmit a light sensing signal.

According to some embodiments, the data lines DL may include a first data line DL1 located in the first bypass side area SDA1 and a second data line DL2 located in the second bypass side area SDA2.

The first auxiliary lines ASL1 may include a first bypass auxiliary line TASL1 electrically connected to the first data line DL1 of the first bypass side area SDA1.

The second auxiliary lines TASL2 may include a second bypass auxiliary line TASL2 paired with the second data line DL2 of the second bypass side area SDA2 and electrically connected to the first bypass auxiliary line TASL1.

According to some embodiments, the circuit layer 120 may further include data supply lines DSPL located in the non-display area NDA and electrically connected to the display driving circuit 200 and the data lines DL.

The data supply lines DSPL may include a first data supply line DSPL1 that transmits the data signal of the first data line DL1, and a second data supply line DSPL2 that transmits the data signal of the second data line DL2.

According to some embodiments, the data supply lines DSPL may extend to the second bypass side area SDA2 and the bypass middle area MDDA.

Accordingly, the first data supply line DSPL1 may extend to the second bypass auxiliary line TASL2 of the second bypass side area SDA2, and may be electrically connected to the first data line DL1 through the second bypass auxiliary line TASL2 and the first bypass auxiliary line TASL1.

On the other hand, the second data supply line DSPL2 may extend to the second bypass side area SDA2, and may be electrically connected to the second data line DL2 directly.

The data lines DL may further include a third data line DL3 located in the bypass middle area MDDA, and the data supply lines DSPL may further include a third data supply line DSPL3 transmitting a data signal of the third data line DL3.

The third data supply line DSPL3 may extend to the bypass middle area MDDA, and may be electrically connected to the third data line DL3 directly.

In this way, because the first data supply line DSPL1 extends not to the first data line DL1 of the first bypass side area SDA1 but to the second bypass auxiliary line TASL2 of the second bypass side area SDA2, the extension length of the first data supply line DSPL1 may be shortened. As a result, the width of the area required for the arrangement of the data supply lines DSPL may be reduced, so that the width of the non-display area NDA may be reduced.

In addition, because the data supply lines DSPL are not located in a portion of the non-display area NDA located between the bent corner of the substrate 110 and the first bypass side area SDA1, the width of the non-display area NDA can be further reduced.

The first bypass auxiliary line TASL1 extends from the second bypass auxiliary line TASL2 to the first data line DL1.

The second bypass auxiliary line TASL2 extends from the first data supply line DSPL1 of the non-display area NDA to the first bypass auxiliary line TASL1.

In this way, as the first bypass auxiliary line TASL1 and the second bypass auxiliary line TASL2 are limitedly arranged in the bypass area DEA, the ends of the first bypass auxiliary line TASL1 and the ends of the second bypass auxiliary line TASL2 are arranged with regularity. Accordingly, visibility of the first bypass auxiliary line TASL1 and the second bypass auxiliary line TASL2 may be increased.

To prevent this, the first auxiliary lines ASL1 may further include not only the first bypass auxiliary line TASL1 but also second power auxiliary horizontal lines VSAHL. Also, the second auxiliary lines ASL2 may further include not only the second bypass auxiliary lines TASL2 but also second power auxiliary vertical lines VSAVL.

Two of the second power auxiliary horizontal lines VSAHL may extend from both ends of the first bypass auxiliary line TASL1 to the non-display area NDA.

One of the second power auxiliary vertical lines VSAVL may extend from one end of the second bypass auxiliary line TASL2 to the non-display area NDA in a direction away from the sub-region SBA.

Accordingly, a part of each second data line DL2 is paired with the second bypass auxiliary line TASL2, and the other part of the second data line DL2 may be paired with the one second power auxiliary vertical line VSAVL extending from the one end of the second bypass auxiliary line TASL2.

Because the second bypass auxiliary line TASL2 is located only in the second bypass side area SDA2, the first data line DL1 of the first bypass side area SDA1 may be paired with the second power auxiliary vertical line VSAVL in overall.

The third data line DL3 of the bypass middle area MDDA may be paired with the second power auxiliary vertical line VSAVL in overall.

The circuit layer 120 may further include a first power supply line VDSPL and a second power supply line VSSPL that respectively transmit the first power ELVDD and the second power ELVSS for driving the light emitting elements LE.

The first power supply line VDSPL and the second power supply line VSSPL may be located in the non-display area NDA and may extend to the sub-region SBA.

The first power supply line VDSPL may be electrically connected to a first power pad for transmitting the first power ELVDD among the signal pads SPD located in the second sub-region SB2.

The second power supply line VSSPL may be electrically connected to a second power pad for transmitting the second power ELVSS among the signal pads SPD located in the second sub-region SB2.

The second power auxiliary horizontal lines VSAHL may be electrically connected to the second power supply line VSSPL and may transmit the second power ELVSS.

The second power auxiliary vertical lines VSAVL may be electrically connected to the second power auxiliary horizontal lines VSAHL and the second power supply line VSSPL to transmit the second power ELVSS.

According to some embodiments, the circuit layer 120 may include the anode initialization voltage line VAIL transmitting the anode initialization voltage VAINT, and the gate initialization voltage line VGIL transmitting the gate initialization voltage VGINT.

Meanwhile, the emission areas EA may include the first emission area EA1, the second emission area EA2, and the third emission area EA3.

The first emission area EA1, the second emission area EA2, and the third emission area EA3 may be arranged side by side in the second direction DR2.

The first emission area EA1 and the third emission area EA3 may be arranged alternately in the first direction DR1.

The second emission areas EA2 may be arranged side by side in the first direction DR1. The second emission area EA2 may be adjacent to the first emission area EA1 and the third emission area EA3 in a fourth direction DR4 or a fifth direction DR5 oblique to the first direction DR1 and the second direction DR2.

Because the second emission area EA2 has a smaller width than the first emission area EA1 and the third emission area EA3, when the light emitting element of the second emission area EA2 is initialized to the same voltage level as the light emitting elements of the first emission area EA1 and the third emission area EA3, it may be difficult to display luminance corresponding to the data signal Vdata.

Therefore, according to some embodiments, the anode initialization voltage line VAIL may include a first anode initialization voltage line VAIL1 (see FIG. 13) transmitting a first anode initialization voltage, and a second anode initialization voltage line VAIL2 (see FIG. 13) transmitting a second anode initialization voltage at a voltage level different from the first anode initialization voltage.

In one example, the first anode initialization voltage may be for initializing the light emitting elements in the first and third emission areas EA1 and EA3, and the second anode initialization voltage may be for initializing the light emitting element in the second emission area EA2.

That is, the circuit layer 120 according to some embodiments may include the first anode initialization voltage line VAIL1 transmitting the first anode initialization voltage, the second anode initialization voltage line VAIL2 transmitting the second anode initialization voltage, and the gate initialization voltage line VGIL transmitting the gate initialization voltage VGINT.

According to some embodiments, each of the light emitting pixel drivers EPD may overlap one data line DL, one second auxiliary line ASL2, and one first auxiliary line ASL1.

According to some embodiments, at least one read-out line ROL may be located between two data lines DL that overlap any two light emitting pixel drivers EPD adjacent in the first direction DR1.

According to some embodiments, one of the mesh auxiliary lines MAL may be located between two second auxiliary lines ASL2 that overlap other two light emitting pixel drivers EPD adjacent in the first direction DR1.

The mesh auxiliary lines MAL extend in the second direction DR2 and are electrically connected to constant voltage lines extending in the first direction DR1 to provide a mesh-shaped wiring structure. The constant voltage lines may include the gate initialization voltage line VGIL transmitting the gate initialization voltage VGINT, the anode initialization voltage line VAIL transmitting the anode initialization voltage VAINT, the second power auxiliary horizontal line VSAHL transmitting the second power ELVSS, and the like.

That is, the mesh auxiliary lines MAL may include a first mesh auxiliary line MAL1 electrically connected to the first anode initialization voltage line VAIL1, a second mesh auxiliary line MAL2 electrically connected to the second anode initialization voltage line VAIL2, a third mesh auxiliary line MAL3 electrically connected to the gate initialization voltage line VGIL, and a fourth mesh auxiliary line MAL4 electrically connected to at least one of the second power auxiliary horizontal lines VSAHL.

Referring to FIG. 12, the data lines DL, the second auxiliary lines ASL2, the mesh auxiliary lines MAL, and the read-out lines ROL may be located on at least one insulating layer (e.g., the first planarization layer 127 and the second planarization layer 128) that covers the first auxiliary lines ASL1.

For example, the first auxiliary lines ASL1 may be located in the first source-drain conductive layer on the second interlayer insulating layer 126, and covered with the first planarization layer 127.

The data lines DL, the second auxiliary lines ASL2, the mesh auxiliary lines MAL, and the read-out lines ROL may be located in the third source/drain conductive layer on the second planarization layer 128.

In this case, the first data line DL1 may be electrically connected to the first bypass auxiliary line TASL1 through a contact hole penetrating the second planarization layer 128 and the first planarization layer 127.

The second bypass auxiliary line TASL2 may also be electrically connected to the first bypass auxiliary line TASL1 through a contact hole penetrating the second planarization layer 128 and the first planarization layer 127.

Figure 13:
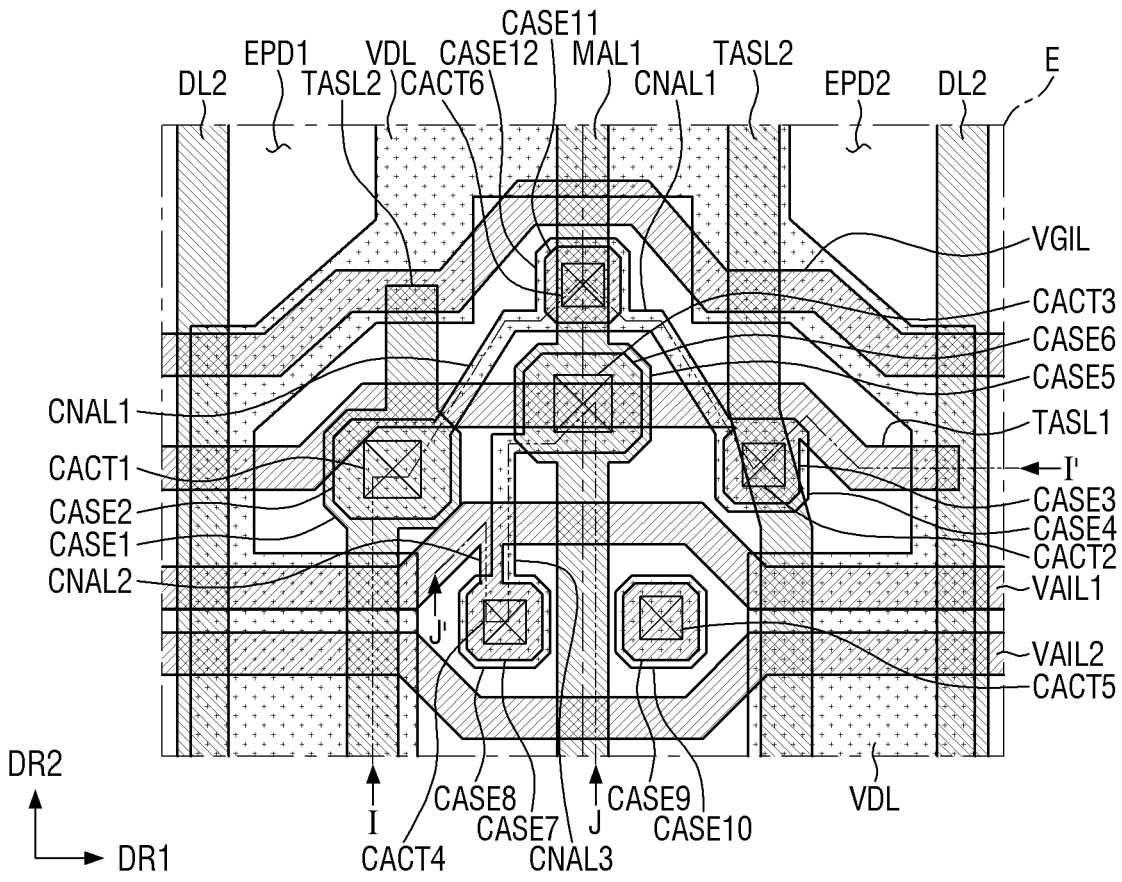
FIG. 13 is a plan view showing part E of FIG. 11 according to some embodiments.
Figure 14:
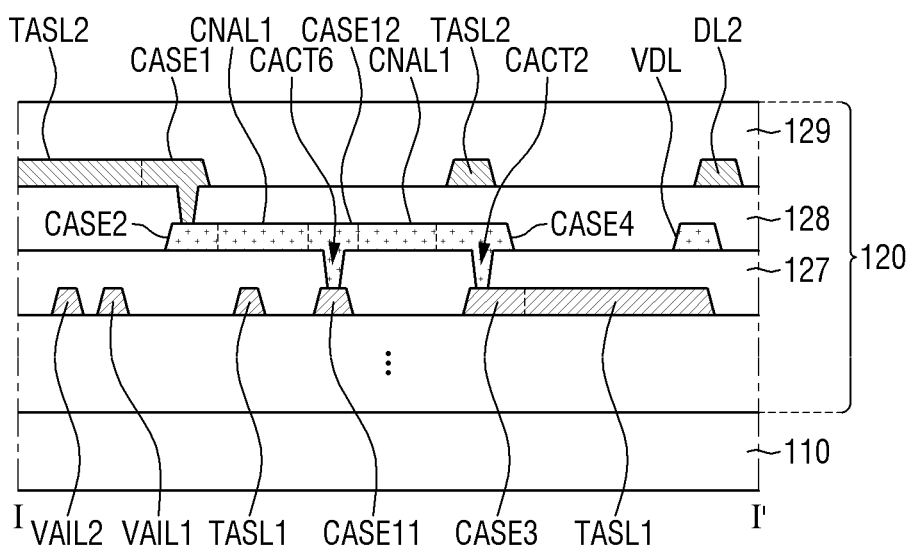
FIG. 14 is a cross-sectional view taken along the line I-I' of FIG. 13.
Figure 14:
Figure 15:
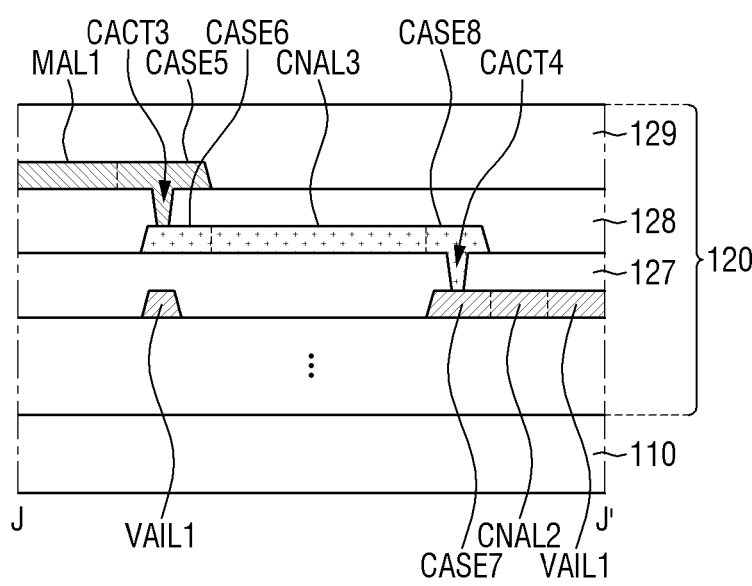
FIG. 15 is a cross-sectional view taken along the line J-J' of FIG. 13.
Figure 15:
Figure 16:
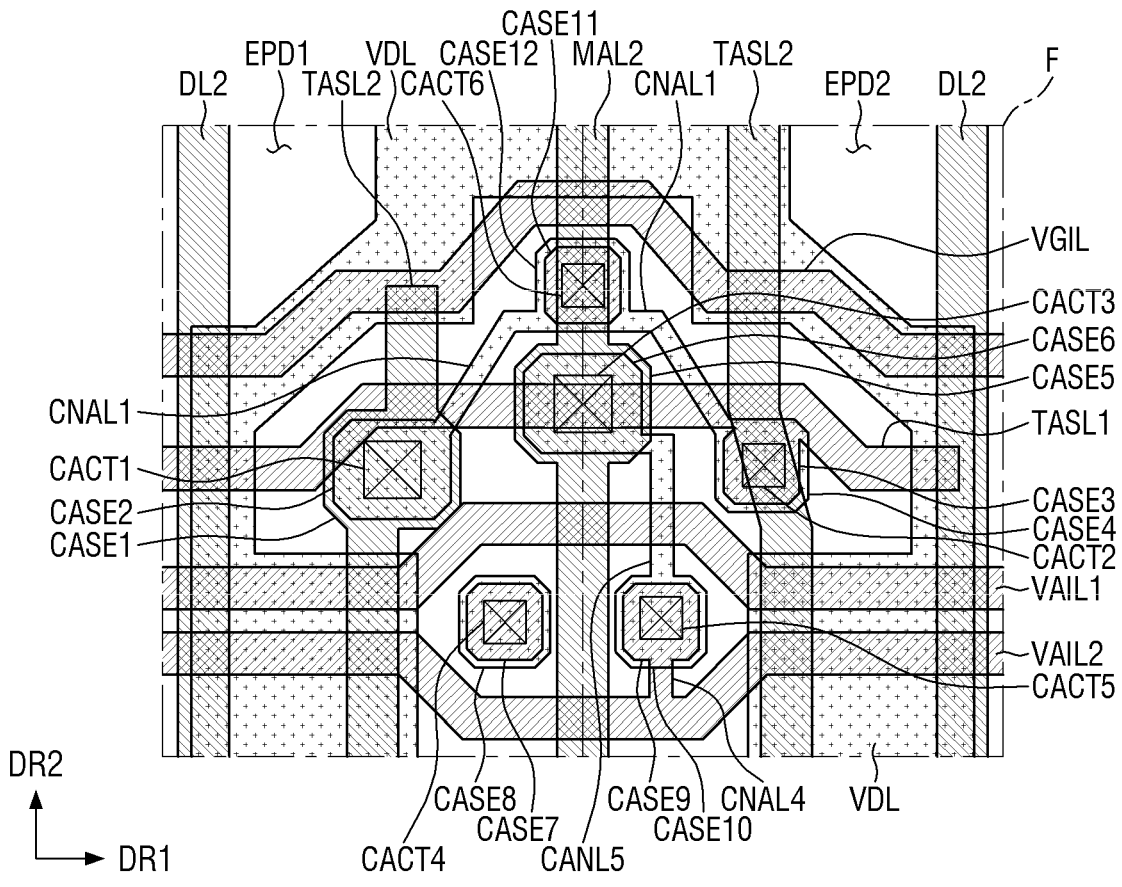
FIG. 16 is a plan view showing part F of FIG. 11 according to some embodiments.
Figure 17:
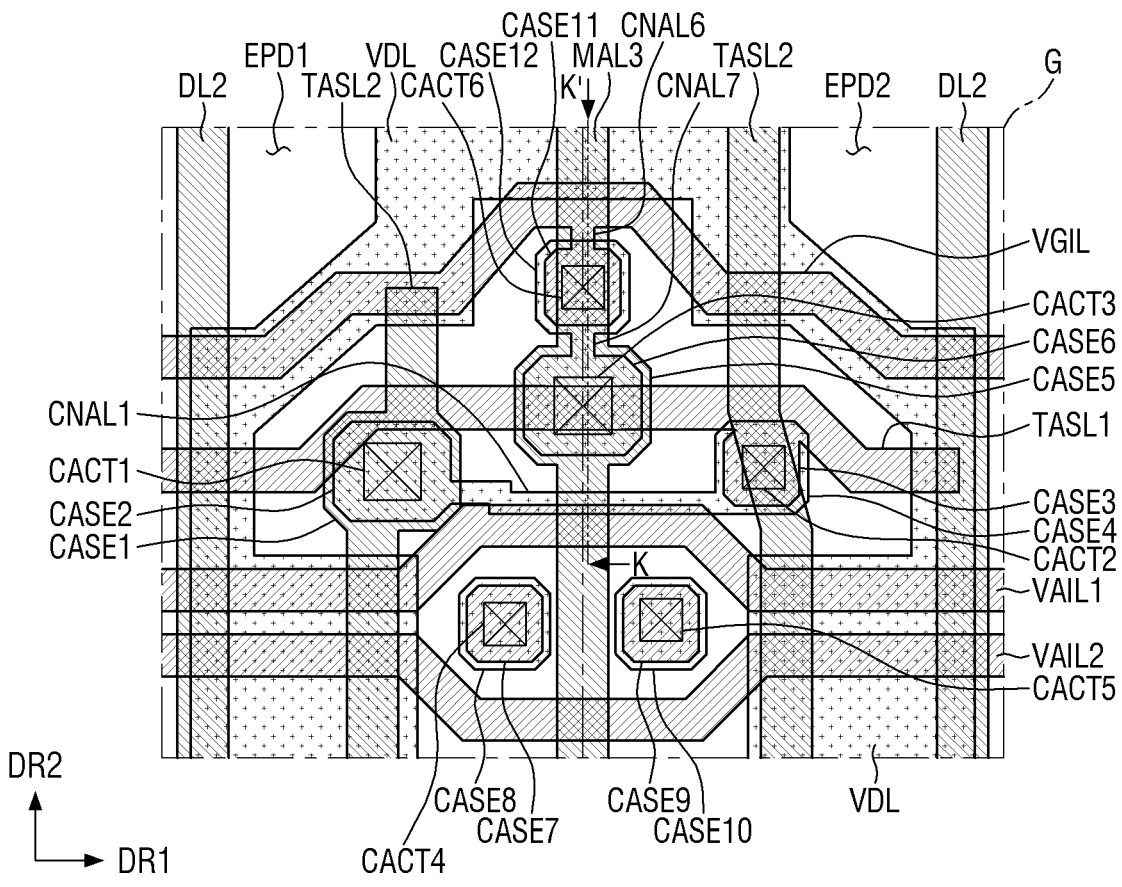
FIG. 17 is a plan view showing part G of FIG. 11 according to some embodiments.
Figure 18:
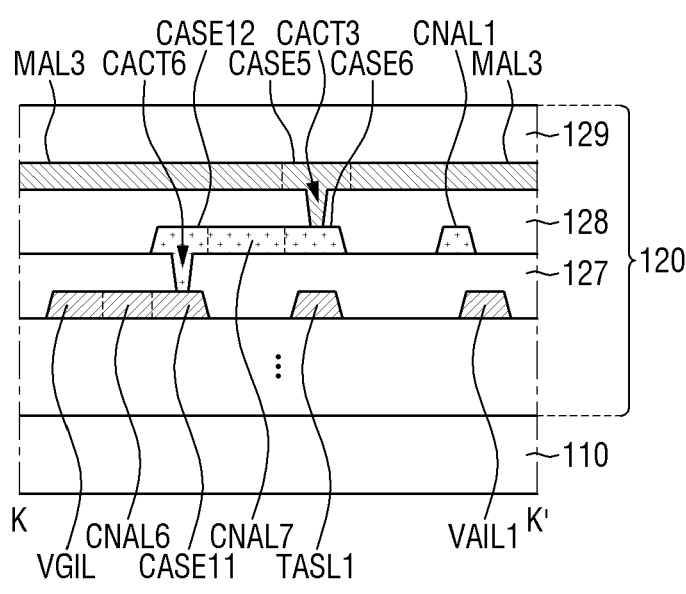
FIG. 18 is a cross-sectional view taken along the line K-K' of FIG. 17.

FIG. 13 is a plan view showing part E of FIG. 11 according to some embodiments. FIG. 14 is a cross-sectional view taken along line I-I' of FIG. 13. FIG. 15 is a cross-sectional view taken along line J-J' of FIG. 13. FIG. 16 is a plan view showing part F of FIG. 11 according to some embodiments. FIG. 17 is a plan view showing part G of FIG. 11 according to some embodiments. FIG. 18 is a cross-sectional view taken along line K-K' of FIG. 17.

In each of FIGS. 13, 16, and 17, any two light emitting pixel drivers EPD located in the second bypass side area SDA2 and adjacent to each other in the first direction DR1 are illustrated as a first light emitting pixel driver EPD1 and a second light emitting pixel driver EPD2. In this case, the first light emitting pixel driver EPD1 and the second light emitting pixel driver EPD2 may be electrically connected to the second data lines DL2, respectively.

Referring to FIGS. 13, 16, and 17, the circuit layer 120 of the display device 100 according to some embodiments may further include a first connection auxiliary electrode CASE1 located in the first light emitting pixel driver EPD1 and connected to one second auxiliary line ASL2 (i.e., the second bypass auxiliary line TASL2 in FIGS. 13, 16, and 17) overlapping the first light emitting pixel driver EPD1, a second connection auxiliary electrode CASE2 overlapping the first connection auxiliary electrode CASE1 and electrically connected to the first connection auxiliary electrode CASE1 through a first connection auxiliary contact hole CACT1, a third connection auxiliary electrode CASE3 connected to one first auxiliary line ASL1 (i.e., the first bypass auxiliary line TASL1 in FIGS. 13, 16, and 17) overlapping the first and second light emitting pixel drivers EPD1 and EPD2, and a fourth connection auxiliary electrode CASE4 overlapping the third connection auxiliary electrode CASE3 and electrically connected to the third connection auxiliary electrode CASE3 through a second connection auxiliary contact hole CACT2.

According to some embodiments, a third connection auxiliary electrode CASE3 and the fourth connection auxiliary electrode CASE4 overlapping it may be located in the second light emitting pixel driver EPD2.

According to some embodiments, the circuit layer 120 may further include a fifth connection auxiliary electrode CASE5 located adjacent to an intersection area between the mesh auxiliary line MAL (i.e., MAL1 in FIG. 13, MAL2 in FIG. 16, MAL3 in FIG. 17, and MAL4 in FIG. 19) and one first auxiliary line ASL1 and connected to the mesh auxiliary line MAL, and a sixth connection auxiliary electrode CASE6 overlapping the fifth connection auxiliary electrode CASE5 and electrically connected to the fifth connection auxiliary electrode CASE5 through a third connection auxiliary contact hole CACT3.

According to some embodiments, one first anode initialization voltage line VAIL1 overlapping the first and second light emitting pixel drivers EPD1 and EPD2 may be located adjacent to one side (e.g., lower side) of one first auxiliary line ASL1 in the second direction DR2. In addition, one second anode initialization voltage line VAIL2 overlapping the first and second light emitting pixel drivers EPD1 and EPD2 may be located adjacent to one side of the first anode initialization voltage line VAIL1 in the second direction DR2.

According to some embodiments, the circuit layer 120 may further include a seventh connection auxiliary electrode CASE7 located between the first and second anode initialization voltage lines VAIL1 and VAIL2 in the second direction DR2 in the first light emitting pixel driver EPD1 and spaced apart from the first and second anode initialization voltage lines VAIL1 and VAIL2, an eighth connection auxiliary electrode CASE8 overlapping the seventh connection auxiliary electrode CASE7 and electrically connected to the seventh connection auxiliary electrode CASE7 through a fourth connection auxiliary contact hole CACT4, a ninth connection auxiliary electrode CASE9 located between the first and second anode initialization voltage lines VAIL1 and VAIL2 in the second direction DR2 in the second light emitting pixel driver EPD2 and spaced apart from the first and second anode initialization voltage lines VAIL1 and VAIL2, and a tenth connection auxiliary electrode CASE10 overlapping the ninth connection auxiliary electrode CASE9 and electrically connected to the ninth connection auxiliary electrode CASE9 through a fifth connection auxiliary contact hole CACT5.

According to some embodiments, one gate initialization voltage line VGIL overlapping the first and second light emitting pixel drivers EPD1 and EPD2 may be located adjacent to the other side (e.g., upper side) of one first auxiliary line ASL1 in the second direction DR2.

According to some embodiments, the circuit layer 120 may further include an eleventh connection auxiliary electrode CASE11 located between the gate initialization voltage line VGIL and one first auxiliary line ASL1, and a twelfth connection auxiliary electrode CASE12 overlapping the eleventh connection auxiliary electrode CASE11 and electrically connected to the eleventh connection auxiliary electrode CASE11 through a sixth connection auxiliary contact hole CACT6.

According to some embodiments, the circuit layer 120 may include the first power line VDL transmitting the first power ELVDD. The first power line VDL may be located in the same layer as the second connection auxiliary electrode CASE2, the fourth connection auxiliary electrode CASE4, the sixth connection auxiliary electrode CASE6, the eighth connection auxiliary electrode CASE8, the tenth connection auxiliary electrode CASE10, and the twelfth connection auxiliary electrode CASE12.

In one example, the first power line VDL, the second connection auxiliary electrode CASE2, the fourth connection auxiliary electrode CASE4, the sixth connection auxiliary electrode CASE6, the eighth connection auxiliary electrode CASE8, the tenth connection auxiliary electrode CASE10, and the twelfth connection auxiliary electrode CASE12 may be located in the second source/drain conductive layer on the first planarization layer 127.

Accordingly, the first power line VDL may be spaced apart from the second connection auxiliary electrode CASE2, the fourth connection auxiliary electrode CASE4, the sixth connection auxiliary electrode CASE6, the eighth connection auxiliary electrode CASE8, the tenth connection auxiliary electrode CASE10, and the twelfth connection auxiliary electrode CASE12. That is, the first power line VDL may be arranged to surround an area where the second connection auxiliary electrode CASE2, the fourth connection auxiliary electrode CASE4, the sixth connection auxiliary electrode CASE6, the eighth connection auxiliary electrode CASE8, the tenth connection auxiliary electrode CASE10, and the twelfth connection auxiliary electrode CASE12 are located.

Referring to FIGS. 13 and 14, the first light emitting pixel driver EPD1 may overlap an intersection area between the first and second bypass auxiliary lines TASL1 and TASL2.

In this case, the circuit layer 120 may further include a first connection auxiliary line CNAL1 that connects the second connection auxiliary electrode CASE2 to the fourth connection auxiliary electrode CASE4.

The second connection auxiliary electrode CASE2 may be electrically connected to the second bypass auxiliary line TASL2 through the first connection auxiliary contact hole CACT1 and the first connection auxiliary electrode CASE1.

The fourth connection auxiliary electrode CASE4 may be electrically connected to the first bypass auxiliary line TASL1 through the second connection auxiliary contact hole CACT2 and the third connection auxiliary electrode CASE3.

Accordingly, when the first connection auxiliary line CNAL1 is provided to connect the second connection auxiliary electrode CASE2 to the fourth connection auxiliary electrode CASE4, the second bypass auxiliary line TASL2 may be electrically connected to the first bypass auxiliary line TASL1 through the first connection auxiliary electrode CASE1, the first connection auxiliary contact hole CACT1, the second connection auxiliary electrode CASE2, the first connection auxiliary line CNAL1, the fourth connection auxiliary electrode CASE4, the second connection auxiliary contact hole CACT2, and the third connection auxiliary electrode CASE3.

The first connection auxiliary line CNAL1 may be located adjacent to the gate initialization voltage line VGIL. In this case, the first connection auxiliary line CNAL1 may be connected to the twelfth connection auxiliary electrode CASE12 located between the gate initialization voltage line VGIL and the first bypass auxiliary line TASL1. In this way, the length of the first connection auxiliary line CNAL1 may be reduced while reducing the possibility of disconnection of the first connection auxiliary line CNAL1, which may be advantageous in reducing the width of the light emitting pixel drivers EPD.

That is, even if the third connection auxiliary electrode CASE3 connected to one first bypass auxiliary line TASL1 overlapping the first and second light emitting pixel drivers EPD1 and EPD2 is not provided in the first light emitting pixel driver EPD1, electrical connection between one second bypass auxiliary line TASL2 overlapping the first light emitting pixel driver EPD1 and one first bypass auxiliary line TASL1 may be implemented through the first connection auxiliary line CNAL1.

As described above, according to some embodiments, among the first and second light emitting pixel drivers EPD1 and EPD2, the first connection auxiliary electrode CASE1 may be located only in the first light emitting pixel driver EPD1, and the third connection auxiliary electrode CASE3 may be located only in the second light emitting pixel driver EPD2.

That is, the first light emitting pixel driver EPD1 and the second light emitting pixel driver EPD2 may include only different one of the first connection auxiliary electrode CASE1 and the third connection auxiliary electrode CASE3, so that the widths of the light emitting pixel drivers EPD may be reduced, leading to an improvement in resolution.

Meanwhile, although not separately shown in the drawing, for electrical connection between another second bypass auxiliary line TASL2 overlapping the second light emitting pixel driver EPD2 and one first bypass auxiliary line TASL1, the positions of the first connection auxiliary electrode CASE1 and the third connection auxiliary electrode CASE3 may be reversed in the first direction DR1. That is, the first connection auxiliary electrode CASE1 and the second connection auxiliary electrode CASE2 may be located in the second light emitting pixel driver EPD2, and the third connection auxiliary electrode CASE3 and the fourth connection auxiliary electrode CASE4 may be located in the first light emitting pixel driver EPD1.

Referring to FIGS. 13 and 15, among the mesh auxiliary lines MAL, the first mesh auxiliary line MAL1 electrically connected to the first anode initialization voltage line VAIL1 may be located adjacent to the boundary between the first light emitting pixel driver EPD1 and the second light emitting pixel driver EPD2. In this case, the circuit layer 120 may further include a second connection auxiliary line CNAL2 that connects the first anode initialization voltage line VAIL1 to the seventh connection auxiliary electrode CASE7, and a third connection auxiliary line CNAL3 that connects the sixth connection auxiliary electrode CASE6 to the eighth connection auxiliary electrode CASE8.

The seventh connection auxiliary electrode CASE7 may be electrically connected to the eighth connection auxiliary electrode CASE8 through the fourth connection auxiliary contact hole CACT4.

The sixth connection auxiliary electrode CASE6 may be electrically connected to the first mesh auxiliary line MAL1 through the third connection auxiliary contact hole CACT3 and the fifth connection auxiliary electrode CASE5.

Accordingly, when the second connection auxiliary line CNAL2 that connects the seventh connection auxiliary electrode CASE7 to the first anode initialization voltage line VAIL1, and the third connection auxiliary line CNAL3 that connects the sixth connection auxiliary electrode CASE6 to the eighth connection auxiliary electrode CASE8 are provided, the first mesh auxiliary line MAL1 may be electrically connected to the first anode initialization voltage line VAIL1 through the fifth connection auxiliary electrode CASE5, the third connection auxiliary contact hole CACT3, the sixth connection auxiliary electrode CASE6, the third connection auxiliary line CNAL3, the eighth connection auxiliary electrode CASE8, the fourth connection auxiliary contact hole CACT4, the seventh connection auxiliary electrode CASE7, and the second connection auxiliary line CNAL2.

Referring to FIG. 16, among the mesh auxiliary lines MAL, the second mesh auxiliary line MAL2 electrically connected to the second anode initialization voltage line VAIL2 may be located adjacent to the boundary between the first light emitting pixel driver EPD1 and the second light emitting pixel driver EPD2. In this case, the circuit layer 120 may further include a fourth connection auxiliary line CNAL4 that connects the second anode initialization voltage line VAIL2 to the ninth connection auxiliary electrode CASE9, and a fifth connection auxiliary line CNAL5 that connects the sixth connection auxiliary electrode CASE6 to the tenth connection auxiliary electrode CASE10.

The ninth connection auxiliary electrode CASE9 may be electrically connected to the tenth connection auxiliary electrode CASE10 through the fifth connection auxiliary contact hole CACT5.

The sixth connection auxiliary electrode CASE6 may be electrically connected to the second mesh auxiliary line MAL2 through the third connection auxiliary contact hole CACT3 and the fifth connection auxiliary electrode CASE5.

Accordingly, the fourth connection auxiliary line CNAL4 that connects the ninth connection auxiliary electrode CASE9 to the second anode initialization voltage line VAIL2, and the fifth connection auxiliary line CNAL5 that connects the sixth connection auxiliary electrode CASE6 to the tenth connection auxiliary electrode CASE10 are provided, the second mesh auxiliary line MAL2 may be electrically connected to the second anode initialization voltage line VAIL2 through the fifth connection auxiliary electrode CASE5, the third connection auxiliary contact hole CACT3, the sixth connection auxiliary electrode CASE6, the fifth connection auxiliary line CNAL5, the tenth connection auxiliary electrode CASE10, the fifth connection auxiliary contact hole CACT5, the ninth connection auxiliary electrode CASE9, and the fourth connection auxiliary line CNAL4.

Referring to FIGS. 17 and 18, among the mesh auxiliary lines MAL, the third mesh auxiliary line MAL3 electrically connected to the gate initialization voltage line VGIL may be located adjacent to the boundary between the first light emitting pixel driver EPD1 and the second light emitting pixel driver EPD2. In this case, the circuit layer 120 may further include a sixth connection auxiliary line CNAL6 that connects the gate initialization voltage line VGIL to the eleventh connection auxiliary electrode CASE11, and a seventh connection auxiliary line CNAL7 that connects the sixth connection auxiliary electrode CASE6 to the twelfth connection auxiliary electrode CASE12.

The eleventh connection auxiliary electrode CASE11 may be electrically connected to the twelfth connection auxiliary electrode CASE12 through the sixth connection auxiliary contact hole CACT6.

The sixth connection auxiliary electrode CASE6 may be electrically connected to the third mesh auxiliary line MAL3 through the third connection auxiliary contact hole CACT3 and the fifth connection auxiliary electrode CASE5.

Accordingly, when the sixth connection auxiliary line CNAL6 that connects the eleventh connection auxiliary electrode CASE11 to the gate initialization voltage line VGIL, and the seventh connection auxiliary line CNAL7 that connects the sixth connection auxiliary electrode CASE6 to the twelfth connection auxiliary electrode CASE12 are provided, the third mesh auxiliary line MAL3 may be electrically connected to the gate initialization voltage line VGIL through the fifth connection auxiliary electrode CASE5, the third connection auxiliary contact hole CACT3, the sixth connection auxiliary electrode CASE6, the seventh connection auxiliary line CNAL7, the twelfth connection auxiliary electrode CASE12, the sixth connection auxiliary contact hole CACT6, the eleventh connection auxiliary electrode CASE11, and the sixth connection auxiliary line CNAL6.

When the sixth connection auxiliary line CNAL6 is provided to connect the gate initialization voltage line VGIL to the eleventh connection auxiliary electrode CASE11, the first connection auxiliary line CNAL1 may be located adjacent to the first anode initialization voltage line VAIL1 in order to avoid the sixth connection auxiliary line CNAL6. In this case, the first connection auxiliary line CNAL1 may be connected to at least one of the eighth connection auxiliary electrode CASE8 or the tenth connection auxiliary electrode CASE10.

Figure 19:
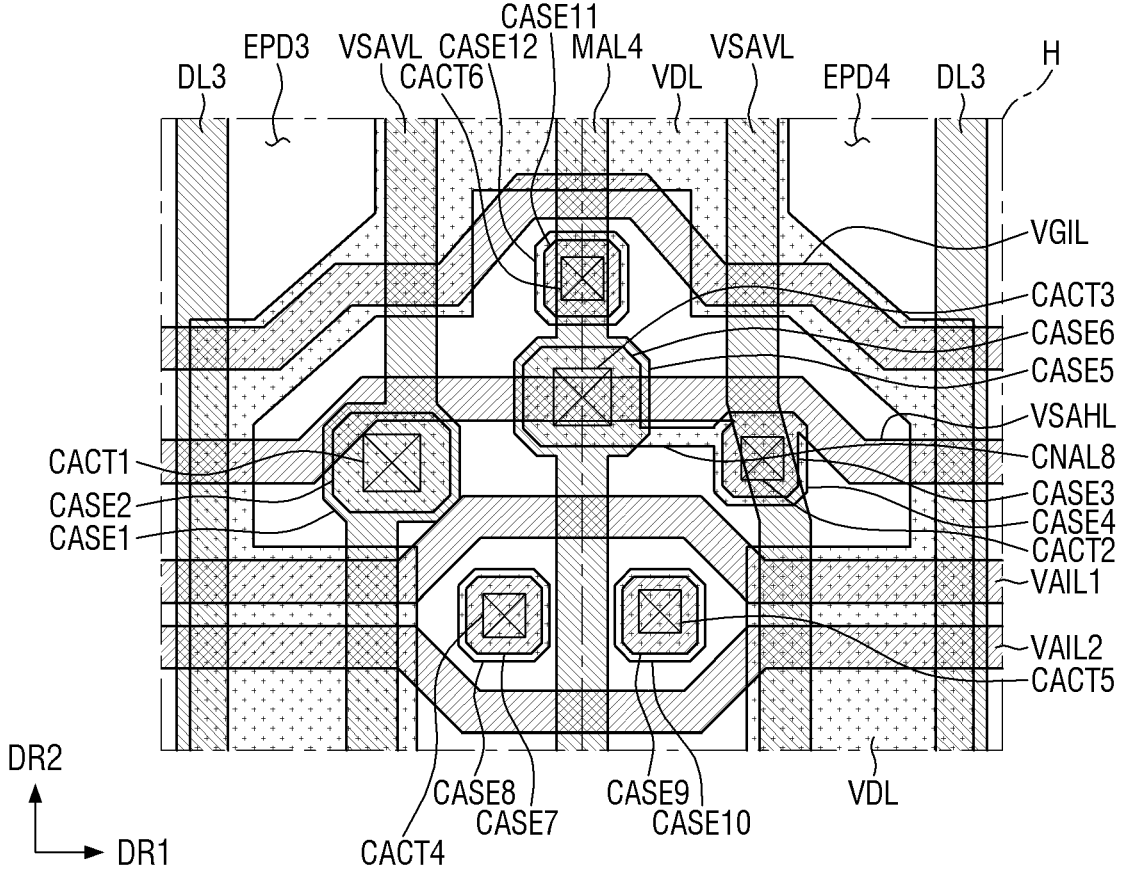
FIG. 19 is a plan view showing part H of FIG. 11 according to some embodiments.
Figure 20:
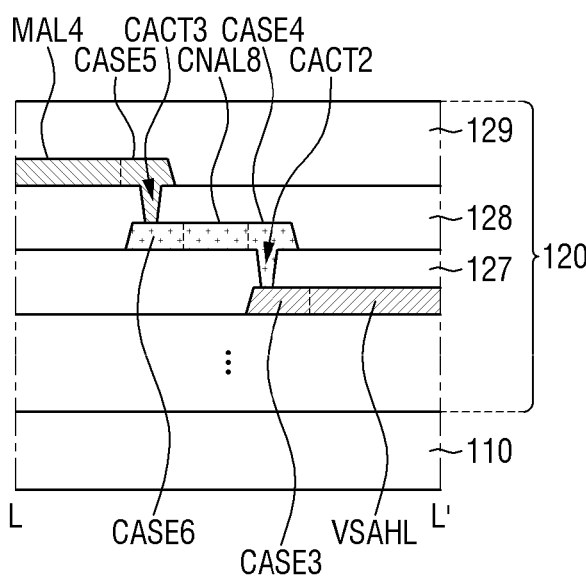
FIG. 20 is a cross-sectional view taken along the line L-L' of FIG. 19.
Figure 20:

FIG. 19 is a plan view showing part H of FIG. 11 according to some embodiments. FIG. 20 is a cross-sectional view taken along line L-L' of FIG. 19.

In FIG. 19, other two light emitting pixel drivers EPD located in the bypass middle area MDDA and adjacent to each other in the first direction DR1 are illustrated as the third and fourth light emitting pixel drivers EPD3 and EPD4. In this case, the third light emitting pixel driver EPD3 and the fourth light emitting pixel driver EPD4 may be electrically connected to the third data lines DL3, respectively. Meanwhile, hereinafter, the third light emitting pixel driver EPD3 and the fourth light emitting pixel driver EPD4 in FIG. 19 may also be referred to as the first light emitting pixel driver EPD1 and the second light emitting pixel driver EPD2 adjacent to each other in the first direction DR1.

Referring to FIG. 19, the third light emitting pixel driver EPD3 and the fourth light emitting pixel driver EPD4 according to some embodiments are substantially the same as the first light emitting pixel driver EPD1 and the second light emitting pixel driver EPD2 shown in FIGS. 13, 16, and 17, except that they overlap the second power auxiliary horizontal line VSAHL instead of the first bypass auxiliary line TASL1 and overlap the second power auxiliary vertical line VSAVL instead of the second bypass auxiliary line TASL2. Therefore, some redundant description of the same or similar elements may be omitted below.

That is, the first connection auxiliary electrode CASE1 located in the third light emitting pixel driver EPD3 is connected to the second power auxiliary vertical line VSAVL, and the third connection auxiliary electrode CASE3 located in the fourth light emitting pixel driver EPD4 is connected to the second power auxiliary horizontal line VSAHL.

The fifth connection auxiliary electrode CASE5, the seventh connection auxiliary electrode CASE7, the ninth connection auxiliary electrode CASE9, and the eleventh connection auxiliary electrode CASE11 in the third and fourth light emitting pixel drivers EPD3 and EPD4 are the same as those in the first and second light emitting pixel drivers EPD1 and EPD2, and thus some redundant description of the same or similar elements may be omitted.

Referring to FIGS. 19 and 20, among the mesh auxiliary lines MAL, the fourth mesh auxiliary line MAL4 electrically connected to the second power auxiliary horizontal line VSAHL may be located adjacent to the boundary between the third light emitting pixel driver EPD3 and the fourth light emitting pixel driver EPD4. In this case, the circuit layer 120 may further include an eighth connection auxiliary line CNAL8 that connects the fourth connection auxiliary electrode CASE4 to the sixth connection auxiliary electrode CASE6.

The fourth connection auxiliary electrode CASE4 may be electrically connected to the second power auxiliary horizontal line VSAHL through the second connection auxiliary contact hole CACT2 and the third connection auxiliary electrode CASE3.

The sixth connection auxiliary electrode CASE6 may be electrically connected to the fourth mesh auxiliary line MAL4 through the third connection auxiliary contact hole CACT3 and the fifth connection auxiliary electrode CASE5.

Accordingly, when the eighth connection auxiliary line CNAL8 is provided to connect the fourth connection auxiliary electrode CASE4 to the sixth connection auxiliary electrode CASE6, the fourth mesh auxiliary line MAL4 may be electrically connected to the second power auxiliary horizontal line VSAHL through the fifth connection auxiliary electrode CASE5, the third connection auxiliary contact hole CACT3, the sixth connection auxiliary electrode CASE6, the eighth connection auxiliary line CNAL8, the fourth connection auxiliary electrode CASE4, the second connection auxiliary contact hole CACT2, and the third connection auxiliary electrode CASE3.

As described above, according to some embodiments, the mesh auxiliary line MAL located adjacent to the boundary between two light emitting pixel drivers EPD1 and EPD2 or EPD3 and EPD4 adjacent in the first direction DR1 may be connected to one fifth connection auxiliary electrode CASE5.

In addition, the sixth connection auxiliary electrode CASE6 electrically connected to the fifth connection auxiliary electrode CASE5 may be selectively connected to one of the third connection auxiliary line CNAL3, the fifth connection auxiliary line CNAL5, the seventh connection auxiliary line CNAL7, and the eighth connection auxiliary line CNAL8, so that each of the mesh auxiliary lines MAL may be electrically connected to one of the first anode initialization voltage line VAIL1, the second anode initialization voltage line VAIL2, the gate initialization voltage line VGIL, and the second power auxiliary horizontal line VSAHL.

That is, electrical connections between the mesh auxiliary line MAL and each of the first anode initialization voltage line VAIL1, the second anode initialization voltage line VAIL2, the gate initialization voltage line VGIL, and the second power auxiliary horizontal line VSAHL may be implemented more simply with only one third connection auxiliary contact hole CACT3.

Accordingly, the widths of the light emitting pixel drivers EPD may be further reduced, which may be advantageous in improving resolution.

Meanwhile, according to some embodiments, the first connection auxiliary electrode CASE1 connected to the second auxiliary line ASL2 is located in one of two light emitting pixel drivers EPD adjacent in the first direction DR1, and the third connection auxiliary electrode CASE3 connected to the first auxiliary line ASL1 is located in the other one of the two light emitting pixel drivers EPD adjacent in the first direction DR1. Accordingly, because the two light emitting pixel drivers EPD adjacent in the first direction DR1 are not symmetrical to each other in the first direction DR1, different image quality may be displayed in the field of view in the first direction DR1.

Figure 21:
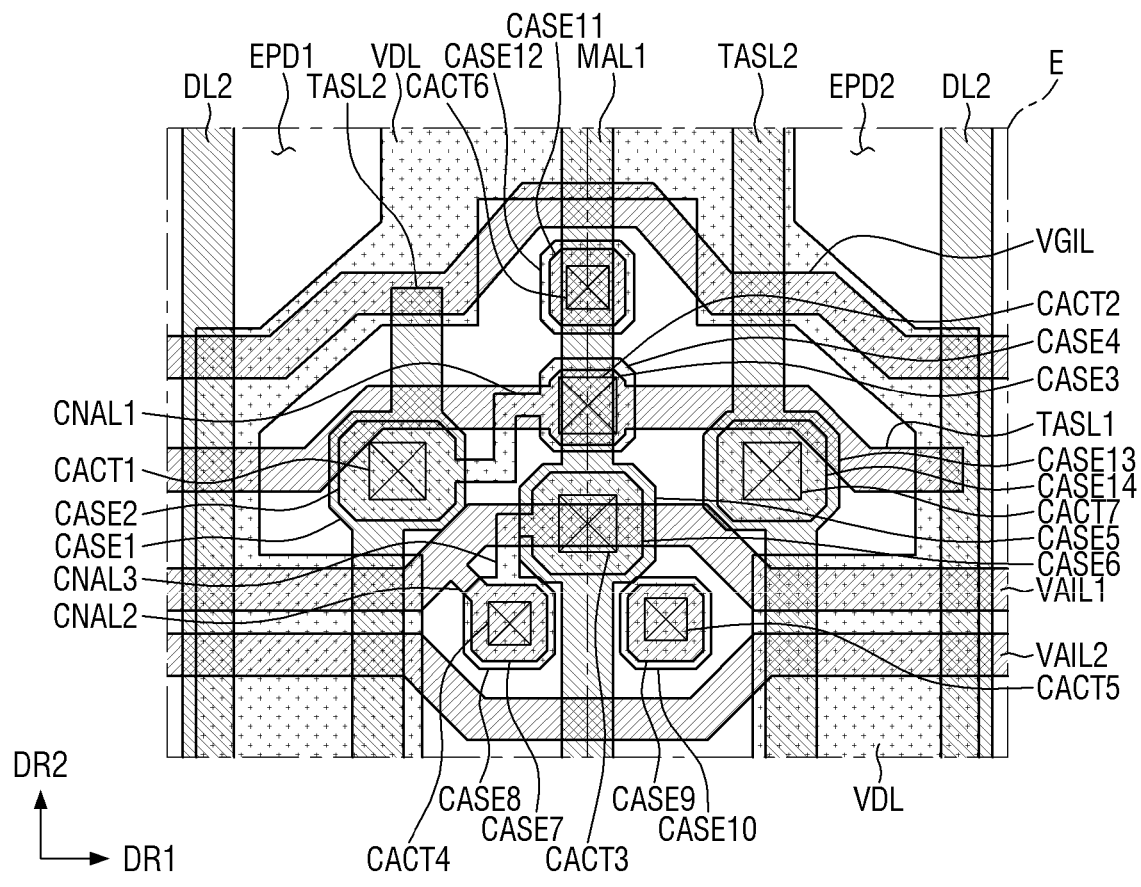
FIG. 21 is a plan view showing part E of FIG. 11 according to some embodiments.
Figure 22:
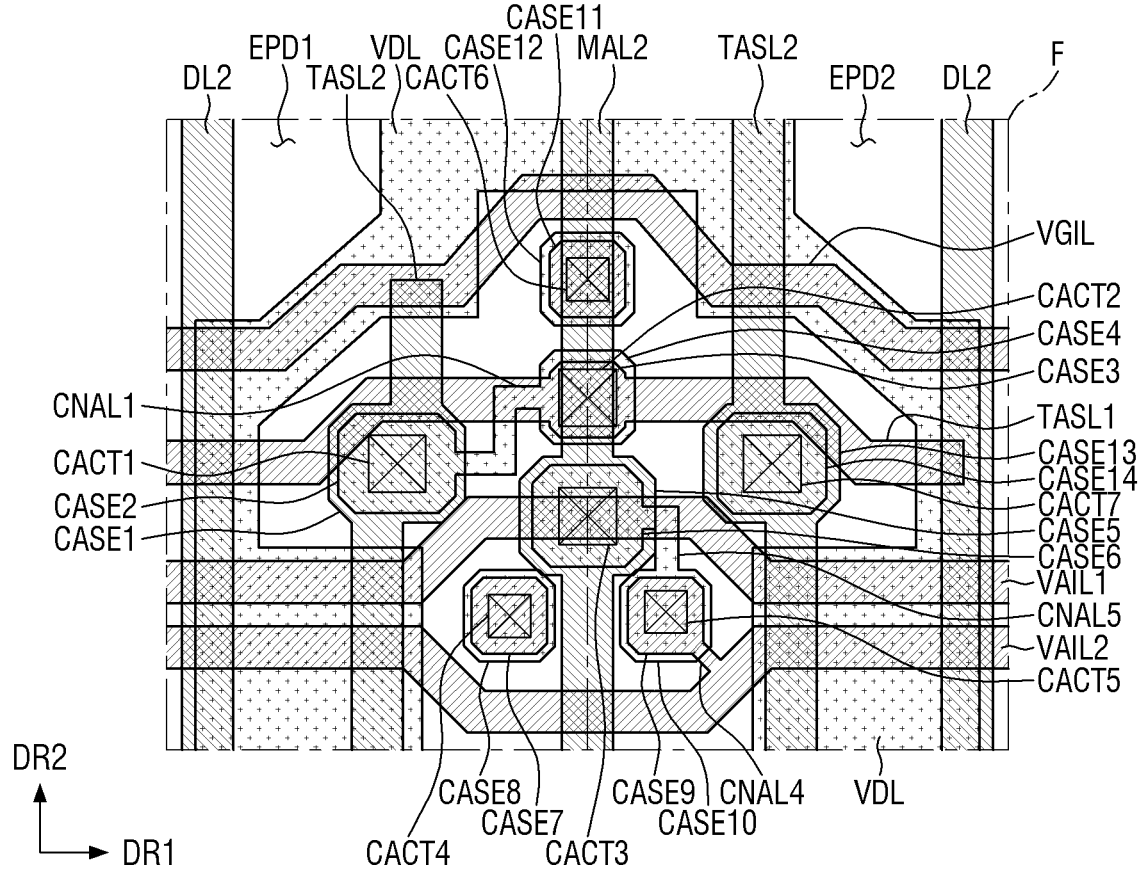
FIG. 22 is a plan view showing part F of FIG. 11 according to some embodiments.
Figure 23:
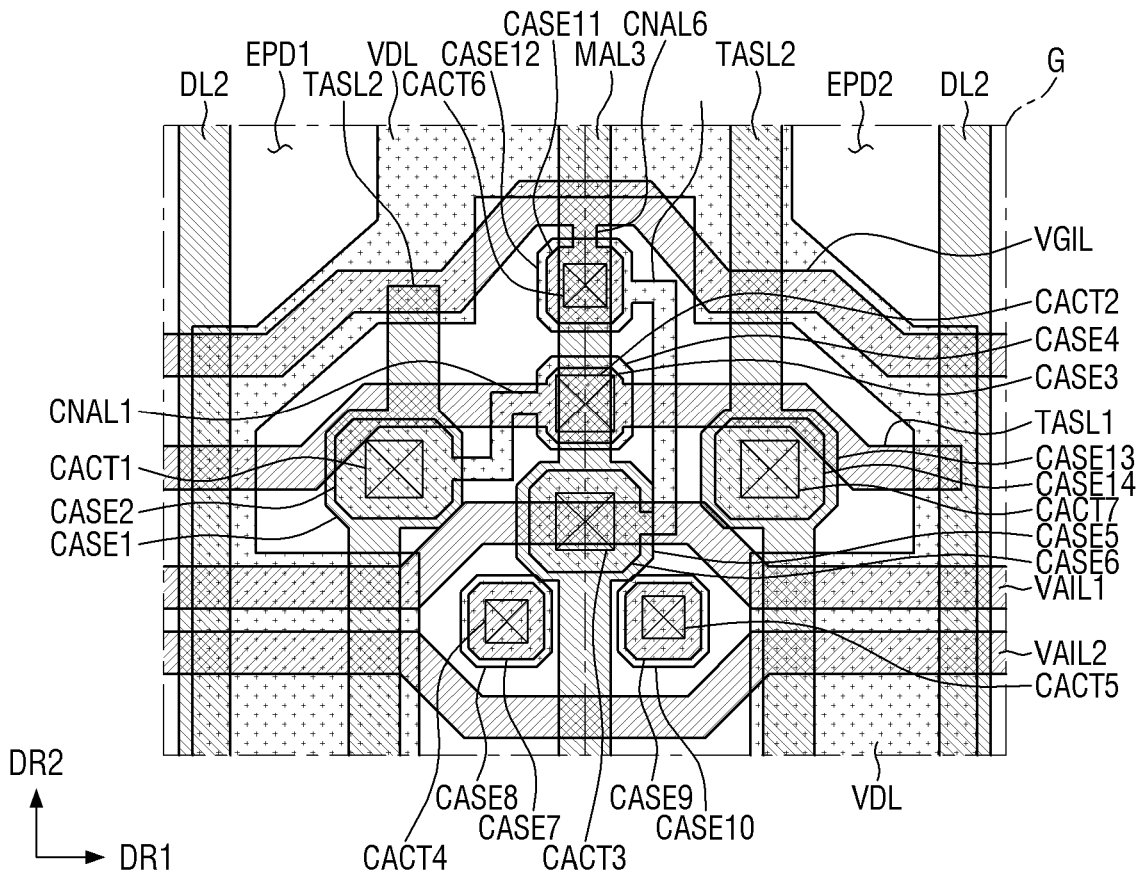
FIG. 23 is a plan view showing part G of FIG. 11 according to some embodiments.
Figure 24:
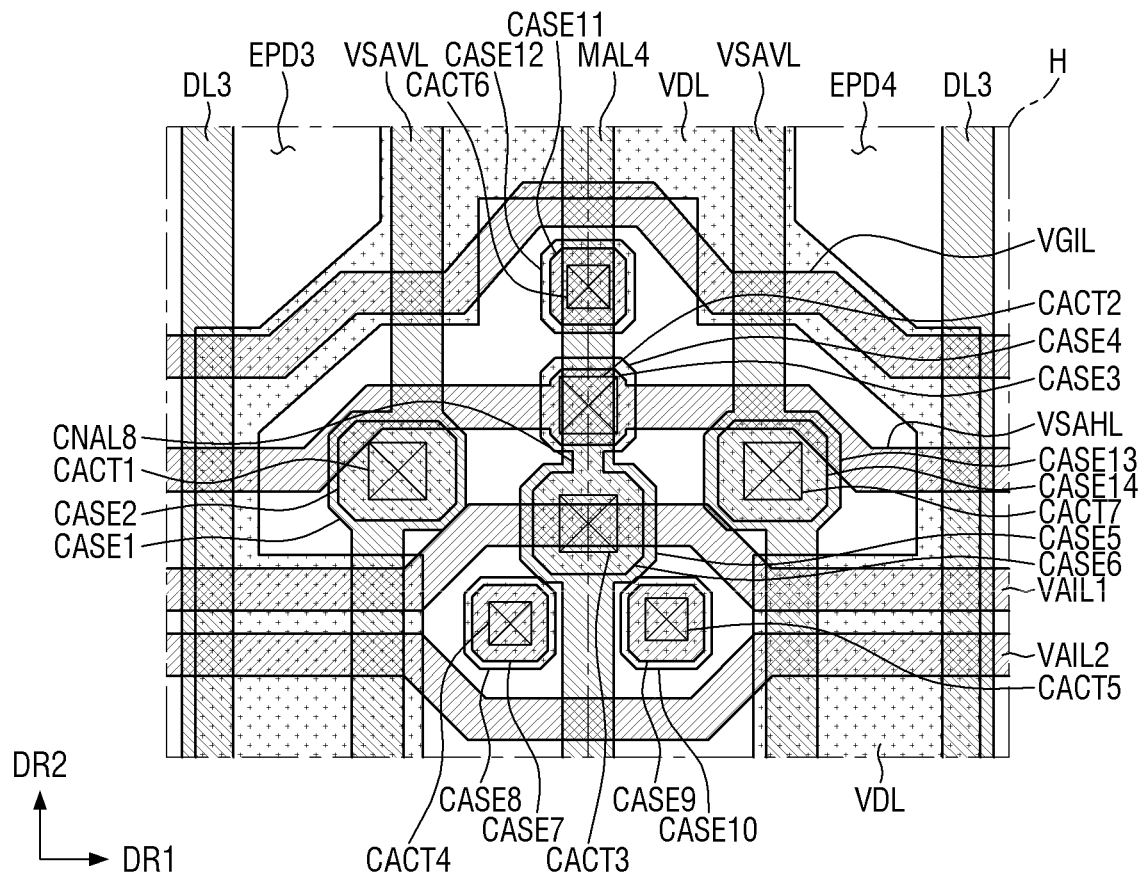
FIG. 24 is a plan view showing part H of FIG. 11 according to some embodiments.
Figure 25:
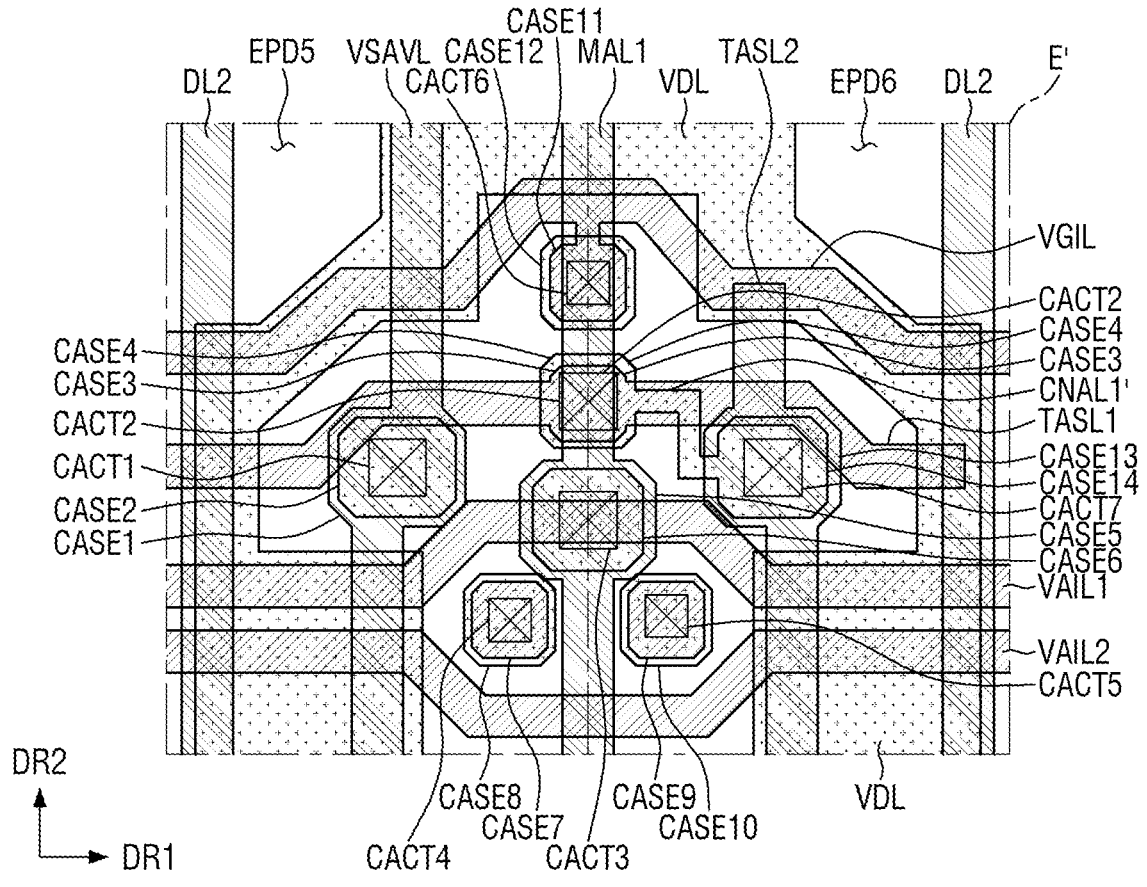
FIG. 25 is a plan view showing part E' of FIG. 11 according to some embodiments.

FIG. 21 is a plan view showing part E of FIG. 11 according to some embodiments. FIG. 22 is a plan view showing part F of FIG. 11 according to some embodiments. FIG. 23 is a plan view showing part G of FIG. 11 according to some embodiments. FIG. 24 is a plan view showing part H of FIG. 11 according to some embodiments. FIG. 25 is a plan view showing part E' of FIG. 11 according to some embodiments.

Referring to FIGS. 21, 22, and 23, the circuit layer 120 of the display device 100 according to some embodiments is substantially the same as that of one embodiments shown with respect to FIGS. 13, 16, and 17, except that the third connection auxiliary electrode CASE3 is located adjacent to the boundary between the first light emitting pixel driver EPD1 and the second light emitting pixel driver EPD2, and the circuit layer 120 further includes a thirteenth connection auxiliary electrode CASE13 and a fourteenth connection auxiliary electrode CASE14 located in the second light emitting pixel driver EPD2. Therefore, some redundant description of the same or similar elements may be omitted below.

Referring to FIG. 24, the circuit layer 120 of the display device 100 according to some embodiments is substantially the same as that of the embodiments shown with respect to FIG. 19, except that the third connection auxiliary electrode CASE3 is located adjacent to the boundary between the third light emitting pixel driver EPD3 and the fourth light emitting pixel driver EPD4, and the circuit layer 120 further includes a thirteenth connection auxiliary electrode CASE13 and a fourteenth connection auxiliary electrode CASE14 located in the fourth light emitting pixel driver EPD4. Therefore, some redundant description of the same or similar elements may be omitted below.

According to some embodiments, the third connection auxiliary electrode CASE3 connected to one first auxiliary line ASL1 that overlaps the first and second light emitting pixel drivers EPD1 and EPD2 may be located adjacent to the boundary between the first light emitting pixel driver EPD1 and the second light emitting pixel driver EPD2. That is, the third connection auxiliary electrode CASE3 may overlap the mesh auxiliary line MAL.

In one example, the third connection auxiliary electrode CASE3 and the fourth connection auxiliary electrode CASE4 overlapping it may be located between the sixth connection auxiliary electrode CASE6 and the twelfth connection auxiliary electrode CASE12 in the second direction DR2.

The thirteenth connection auxiliary electrode CASE13 may be located in the second light emitting pixel driver EPD2 and may be connected to another second auxiliary line ASL2 (i.e., the second bypass auxiliary line TASL2 in FIG. 21) overlapping the second light emitting pixel driver EPD2.

The fourteenth connection auxiliary electrode CASE14 may overlap the thirteenth connection auxiliary electrode CASE13 and may be electrically connected to the thirteenth connection auxiliary electrode CASE13 through a seventh connection auxiliary contact hole CACT7.

In FIG. 25, other two light emitting pixel drivers EPD located in the second bypass side area SDA2 and adjacent to each other in the first direction DR1 are illustrated as a fifth light emitting pixel driver EPD5 and a sixth light emitting pixel driver EPD6. Meanwhile, in the following, the fifth light emitting pixel driver EPD5 and the sixth light emitting pixel driver EPD6 of FIG. 25 may also be referred to as the first light emitting pixel driver EPD1 and the second light emitting pixel driver EPD2 adjacent to each other in the first direction DR1.

Referring to FIG. 25, the fifth and sixth light emitting pixel drivers EPD5 and EPD6 according to some embodiments include the first to fourteenth connection auxiliary electrodes CASE1 to CASE14, similarly to the first and second light emitting pixel drivers EPD1 and EPD2 shown in FIGS. 21, 22, and 23, and the third and fourth light emitting pixel drivers EPD3 and EPD4 shown in FIG. 24. Therefore, some redundant description of the same or similar elements may be omitted.

As shown in FIG. 25, the fifth light emitting pixel driver EPD5 may include an intersection area between the first bypass auxiliary line TASL1 overlapping the fifth and sixth light emitting pixel drivers EPD5 and EPD6, and the second power auxiliary vertical line VSAVL overlapping the fifth light emitting pixel driver EPD5. In addition, the sixth light emitting pixel driver EPD6 may include an intersection area between the first bypass auxiliary line TASL1 overlapping the fifth and sixth light emitting pixel drivers EPD5 and EPD6, and the second bypass auxiliary line TASL2 overlapping the sixth light emitting pixel driver EPD6.

In this case, the circuit layer 120 may further include a first connection auxiliary symmetrical line CNAL1' that connects the fourteenth connection auxiliary electrode CASE14 to the fourth connection auxiliary electrode CASE4.

The fourteenth connection auxiliary electrode CASE14 may be electrically connected to the second bypass auxiliary line TASL2 through the seventh connection auxiliary contact hole CACT7 and the thirteenth connection auxiliary electrode CASE13.

The fourth connection auxiliary electrode CASE4 may be electrically connected to the first bypass auxiliary line TASL1 through the second connection auxiliary contact hole CACT2 and the third connection auxiliary electrode CASE3.

Accordingly, when the first connection auxiliary symmetrical line CNAL1' is provided to connect the fourteenth connection auxiliary electrode CASE14 to the fourth connection auxiliary electrode CASE4, the second bypass auxiliary line TASL2 of the sixth light emitting pixel driver EPD6 may be electrically connected to the first bypass auxiliary line TASL1 through the thirteenth connection auxiliary electrode CASE13, the seventh connection auxiliary contact hole CACT7, the fourteenth connection auxiliary electrode CASE14, the first connection auxiliary symmetrical line CNAL1', the fourth connection auxiliary electrode CASE4, the second connection auxiliary contact hole CACT2, and the third connection auxiliary electrode CASE3.

As described above, according to some embodiments, the first connection auxiliary electrode CASE1 and the thirteenth connection auxiliary electrode CASE13 may be mutually symmetrical with respect to the boundary between the first light emitting pixel driver EPD1 and the second light emitting pixel driver EPD2.

Accordingly, because two light emitting pixel drivers EPD adjacent in the first direction DR1 may be mutually symmetrical in the first direction DR1, variations in optical characteristics caused by two light emitting pixel drivers EPD adjacent in the first direction DR1 may be similarly derived. As a result, the difference in image quality depending on the field of view in the first direction DR1 may be reduced, leading to an improvement in image quality.

However, the effects of the present disclosure are not restricted to the one set forth herein. The above and other effects of the present disclosure will become more apparent to one of daily skill in the art to which the present disclosure pertains by referencing the claims.

What is claimed is:

1. A display device comprising:

a substrate comprising a display area in which emission areas are arranged and a non-display area around the display area;

a circuit layer on the substrate; and an element layer on the circuit layer, and comprising light emitting elements respectively in the emission areas, wherein the circuit layer comprises:

light emitting pixel drivers respectively electrically connected to the light emitting elements, and arranged side by side in a first direction and a second direction;

data lines extending in the second direction, and configured to transmit data signals to the light emitting pixel drivers;

first auxiliary lines extending in the first direction;

second auxiliary lines extending in the second direction and respectively paired with the data lines;

a mesh auxiliary line extending in the second direction, and adjacent to a boundary between a first light emitting pixel driver and a second light emitting pixel driver adjacent in the first direction among the light emitting pixel drivers;

a first connection auxiliary electrode in the first light emitting pixel driver, and connected to one second auxiliary line overlapping the first light emitting pixel driver;

a second connection auxiliary electrode overlapping the first connection auxiliary electrode, and electrically connected to the first connection auxiliary electrode through a first connection auxiliary contact hole;

a third connection auxiliary electrode connected to one first auxiliary line overlapping the first light emitting pixel driver and the second light emitting pixel driver; and a fourth connection auxiliary electrode overlapping the third connection auxiliary electrode, and electrically connected to the third connection auxiliary electrode through a second connection auxiliary contact hole.

2. The display device of claim 1, wherein the circuit layer further comprises:

a fifth connection auxiliary electrode adjacent to an intersection area between the mesh auxiliary line and the one first auxiliary line, and connected to the mesh auxiliary line; and a sixth connection auxiliary electrode overlapping the fifth connection auxiliary electrode, electrically connected to the fifth connection auxiliary electrode through a third connection auxiliary contact hole, and spaced apart from the second connection auxiliary electrode and the fourth connection auxiliary electrode.

3. The display device of claim 2, wherein the circuit layer further comprises:

a first anode initialization voltage line extending in the first direction, adjacent to one side of the one first auxiliary line in the second direction, and configured to transmit a first anode initialization voltage;

a second anode initialization voltage line extending in the first direction, adjacent to one side of the first anode initialization voltage line in the second direction, and configured to transmit a second anode initialization voltage;

a seventh connection auxiliary electrode between the first anode initialization voltage line and the second anode initialization voltage line in the second direction in the first light emitting pixel driver, and spaced apart from the first anode initialization voltage line and the second anode initialization voltage line;

an eighth connection auxiliary electrode overlapping the seventh connection auxiliary electrode, and electrically connected to the seventh connection auxiliary electrode through a fourth connection auxiliary contact hole;

a ninth connection auxiliary electrode between the first anode initialization voltage line and the second anode initialization voltage line in the second direction in the second light emitting pixel driver, and spaced apart from the first anode initialization voltage line and the second anode initialization voltage line; and a tenth connection auxiliary electrode overlapping the ninth connection auxiliary electrode, and electrically connected to the ninth connection auxiliary electrode through a fifth connection auxiliary contact hole, wherein the eighth connection auxiliary electrode is adjacent to one side of the mesh auxiliary line in the first direction, and the tenth connection auxiliary electrode is adjacent to the other side of the mesh auxiliary line in the first direction.

4. The display device of claim 3, wherein the circuit layer further comprises:

a gate initialization voltage line extending in the first direction, adjacent to the other side of the one first auxiliary line in the second direction, and configured to transmit a gate initialization voltage;

an eleventh connection auxiliary electrode between the gate initialization voltage line and the one first auxiliary line; and a twelfth connection auxiliary electrode overlapping the eleventh connection auxiliary electrode, and electrically connected to the eleventh connection auxiliary electrode through a sixth connection auxiliary contact hole, wherein the sixth connection auxiliary electrode and the twelfth connection auxiliary electrode overlap the mesh auxiliary line, and are spaced apart from each other.

5. The display device of claim 4, wherein a bypass area on one side of the display area comprises a bypass middle area at a center, a first bypass side area parallel to the bypass middle area in the first direction and in contact with the non-display area, and a second bypass side area between the bypass middle area and the first bypass side area, the data lines comprise a first data line in the first bypass side area and a second data line in the second bypass side area, the first auxiliary lines comprise a first bypass auxiliary line electrically connected to the first data line, and the second auxiliary lines comprise a second bypass auxiliary line paired with the second data line and electrically connected to the first bypass auxiliary line.

6. The display device of claim 5, wherein the first light emitting pixel driver and the second light emitting pixel driver are in the second bypass side area, the first light emitting pixel driver is electrically connected to the second data line, and overlaps an intersection area between the first bypass auxiliary line and the second bypass auxiliary line, the circuit layer further comprises a first connection auxiliary line connecting the second connection auxiliary electrode to the fourth connection auxiliary electrode, and the second bypass auxiliary line is electrically connected to the first bypass auxiliary line through the first connection auxiliary electrode, the first connection auxiliary contact hole, the second connection auxiliary electrode, the first connection auxiliary line, the fourth connection auxiliary electrode, the second connection auxiliary contact hole, and the third connection auxiliary electrode.

7. The display device of claim 6, wherein the circuit layer further comprises:

a second connection auxiliary line connecting the first anode initialization voltage line to the seventh connection auxiliary electrode; and a third connection auxiliary line connecting the sixth connection auxiliary electrode to the eighth connection auxiliary electrode, wherein the mesh auxiliary line is electrically connected to the first anode initialization voltage line through the fifth connection auxiliary electrode, the third connection auxiliary contact hole, the sixth connection auxiliary electrode, the third connection auxiliary line, the eighth connection auxiliary electrode, the fourth connection auxiliary contact hole, the seventh connection auxiliary electrode, and the second connection auxiliary line.

8. The display device of claim 6, wherein the circuit layer further comprises:

a fourth connection auxiliary line connecting the second anode initialization voltage line to the ninth connection auxiliary electrode; and a fifth connection auxiliary line connecting the sixth connection auxiliary electrode to the tenth connection auxiliary electrode, wherein the mesh auxiliary line is electrically connected to the second anode initialization voltage line through the fifth connection auxiliary electrode, the third connection auxiliary contact hole, the sixth connection auxiliary electrode, the fifth connection auxiliary line, the tenth connection auxiliary electrode, the fifth connection auxiliary contact hole, the ninth connection auxiliary electrode, and the fourth connection auxiliary line.

9. The display device of claim 6, wherein the circuit layer further comprises:

a sixth connection auxiliary line connecting the gate initialization voltage line to the eleventh connection auxiliary electrode; and a seventh connection auxiliary line connecting the sixth connection auxiliary electrode to the twelfth connection auxiliary electrode, wherein the mesh auxiliary line is electrically connected to the gate initialization voltage line through the fifth connection auxiliary electrode, the third connection auxiliary contact hole, the sixth connection auxiliary electrode, the seventh connection auxiliary line, the twelfth connection auxiliary electrode, the sixth connection auxiliary contact hole, the eleventh connection auxiliary electrode, and the sixth connection auxiliary line.

10. The display device of claim 5, wherein the data lines further comprise a third data line in the bypass middle area, the first auxiliary lines further comprise second power auxiliary horizontal lines to which, between a first power and a second power for driving the light emitting elements, the second power is applied, the second auxiliary lines further comprise second power auxiliary vertical lines to which the second power is applied, the first light emitting pixel driver and the second light emitting pixel driver are in the bypass middle area, and overlap one of the second power auxiliary horizontal lines, the first light emitting pixel driver is electrically connected to the third data line, the circuit layer further comprises an eighth connection auxiliary line connecting the fourth connection auxiliary electrode to the sixth connection auxiliary electrode, and the mesh auxiliary line is electrically connected to the one second power auxiliary horizontal line through the fifth connection auxiliary electrode, the third connection auxiliary contact hole, the sixth connection auxiliary electrode, the eighth connection auxiliary line, the fourth connection auxiliary electrode, the second connection auxiliary contact hole, and the third connection auxiliary electrode.

11. The display device of claim 10, further comprising a display driving circuit configured to transmit data signals of the light emitting pixel drivers to the data lines, wherein the circuit layer further comprises data supply lines in the non-display area, and electrically connected between the data lines and the display driving circuit, among the data supply lines, a first data supply line which transmits the data signal of the first data line is electrically connected to the first data line through the first bypass auxiliary line and the second bypass auxiliary line, among the data supply lines, a second data supply line configured to transmit the data signal of the second data line is directly electrically connected to the second data line, and among the data supply lines, a third data supply line configured to transmit the data signal of the third data line is directly electrically connected to the third data line.

12. The display device of claim 4, wherein the third connection auxiliary electrode is in the second light emitting pixel driver.

13. The display device of claim 4, wherein the third connection auxiliary electrode is adjacent to a boundary between the first light emitting pixel driver and the second light emitting pixel driver adjacent in the first direction.

14. The display device of claim 13, wherein the circuit layer further comprises:

a thirteenth connection auxiliary electrode in the second light emitting pixel driver, and connected to another second auxiliary line overlapping the second light emitting pixel driver; and a fourteenth connection auxiliary electrode overlapping the thirteenth connection auxiliary electrode, and electrically connected to the thirteenth connection auxiliary electrode through a seventh connection auxiliary contact hole.

15. A display device comprising:

a substrate comprising a display area in which emission areas are arranged and a non-display area around the display area;

a circuit layer on the substrate; and an element layer on the circuit layer, and comprising light emitting elements respectively in the emission areas, wherein the circuit layer comprises:

light emitting pixel drivers respectively electrically connected to the light emitting elements, and arranged side by side in a first direction and a second direction;

data lines extending in the second direction, and configured to transmit data signals to the light emitting pixel drivers;

first auxiliary lines extending in the first direction;

second auxiliary lines extending in the second direction and respectively paired with the data lines;

mesh auxiliary lines extending in the second direction, and between the second auxiliary lines;

a first anode initialization voltage line extending in the first direction, and configured to transmit a first anode initialization voltage;

a second anode initialization voltage line extending in the first direction, and configured to transmit a second anode initialization voltage;

a gate initialization voltage line extending in the first direction, and configured to transmit a gate initialization voltage; and a first power line configured to transmit, between a first power and a second power for driving the light emitting elements, the first power, wherein the first auxiliary lines comprise:

a first bypass auxiliary line electrically connected to a first data line adjacent to the non-display area in the first direction among the data lines; and second power auxiliary horizontal lines configured to transmit the second power, wherein the second auxiliary lines comprise:

a second bypass auxiliary line paired with a second data line spaced farther apart from the non-display area than the first data line in the first direction among the data lines, and electrically connected to the first bypass auxiliary line; and second power auxiliary vertical lines configured to transmit the second power, wherein the light emitting pixel drivers comprise:

a first light emitting pixel driver comprising an intersection area between the first bypass auxiliary line and the second bypass auxiliary line; and a second light emitting pixel driver adjacent to the first light emitting pixel driver in the first direction, wherein the second bypass auxiliary line is electrically connected to the first bypass auxiliary line through:

a first connection auxiliary electrode connected to the second bypass auxiliary line;

a second connection auxiliary electrode overlapping the first connection auxiliary electrode, and electrically connected to the first connection auxiliary electrode through a first connection auxiliary contact hole;

a third connection auxiliary electrode connected to the first bypass auxiliary line;

a fourth connection auxiliary electrode overlapping the third connection auxiliary electrode, and electrically connected to the third connection auxiliary electrode through a second connection auxiliary contact hole; and a first connection auxiliary line connecting the second connection auxiliary electrode to the fourth connection auxiliary electrode.

16. The display device of claim 15, wherein the mesh auxiliary lines comprise:

a first mesh auxiliary line electrically connected to the first anode initialization voltage line;

a second mesh auxiliary line electrically connected to the second anode initialization voltage line;

a third mesh auxiliary line electrically connected to the gate initialization voltage line; and a fourth mesh auxiliary line electrically connected to at least one of the second power auxiliary horizontal lines.

17. The display device of claim 16, wherein the first mesh auxiliary line is adjacent to a boundary between the first light emitting pixel driver and the second light emitting pixel driver, and the first mesh auxiliary line is electrically connected to the first anode initialization voltage line through:

a fifth connection auxiliary electrode connected to the first mesh auxiliary line;

a sixth connection auxiliary electrode overlapping the fifth connection auxiliary electrode, and electrically connected to the fifth connection auxiliary electrode through a third connection auxiliary contact hole;

a seventh connection auxiliary electrode between the first anode initialization voltage line and the second anode initialization voltage line;

an eighth connection auxiliary electrode overlapping the seventh connection auxiliary electrode, and electrically connected to the seventh connection auxiliary electrode through a fourth connection auxiliary contact hole;

a third connection auxiliary line connecting the first anode initialization voltage line to the seventh connection auxiliary electrode; and a fourth connection auxiliary line connecting the sixth connection auxiliary electrode to the eighth connection auxiliary electrode.

18. The display device of claim 16, wherein the second mesh auxiliary line is adjacent to a boundary between the first light emitting pixel driver and the second light emitting pixel driver, and the second mesh auxiliary line is electrically connected to the second anode initialization voltage line through:

a fifth connection auxiliary electrode connected to the first mesh auxiliary line;

a sixth connection auxiliary electrode overlapping the fifth connection auxiliary electrode, and electrically connected to the fifth connection auxiliary electrode through a third connection auxiliary contact hole;

a ninth connection auxiliary electrode between the first anode initialization voltage line and the second anode initialization voltage line;

a tenth connection auxiliary electrode overlapping the ninth connection auxiliary electrode, and electrically connected to the ninth connection auxiliary electrode through a fifth connection auxiliary contact hole;

a fourth connection auxiliary line connecting the second anode initialization voltage line to the ninth connection auxiliary electrode; and a fifth connection auxiliary line connecting the sixth connection auxiliary electrode to the tenth connection auxiliary electrode.

19. The display device of claim 16, wherein the third mesh auxiliary line is adjacent to a boundary between the first light emitting pixel driver and the second light emitting pixel driver, and the third mesh auxiliary line is electrically connected to the gate initialization voltage line through:

a fifth connection auxiliary electrode connected to the third mesh auxiliary line;

a sixth connection auxiliary electrode overlapping the fifth connection auxiliary electrode, and electrically connected to the fifth connection auxiliary electrode through a third connection auxiliary contact hole;

an eleventh connection auxiliary electrode between the gate initialization voltage line and the sixth connection auxiliary electrode;

a twelfth connection auxiliary electrode overlapping the eleventh connection auxiliary electrode, and electrically connected to the eleventh connection auxiliary electrode through a sixth connection auxiliary contact hole;

a sixth connection auxiliary line connecting the gate initialization voltage line to the eleventh connection auxiliary electrode; and a seventh connection auxiliary line connecting the sixth connection auxiliary electrode to the twelfth connection auxiliary electrode.

20. The display device of claim 16, wherein the light emitting pixel drivers further comprise:

a third light emitting pixel driver comprising an intersection area between one of the second power auxiliary horizontal lines and one of the second power auxiliary vertical lines; and a fourth light emitting pixel driver adjacent to the third light emitting pixel driver in the first direction, and comprising an intersection area between the one second power auxiliary horizontal line and another one of the second power auxiliary vertical lines, wherein the third connection auxiliary electrode is connected to the one second power auxiliary horizontal line, and the fourth mesh auxiliary line is adjacent to a boundary between the third light emitting pixel driver and the fourth light emitting pixel driver, wherein the fourth mesh auxiliary line is electrically connected to the one second power auxiliary horizontal line through:

a fifth connection auxiliary electrode connected to the fourth mesh auxiliary line;

a sixth connection auxiliary electrode overlapping the fifth connection auxiliary electrode, and electrically connected to the fifth connection auxiliary electrode through a third connection auxiliary contact hole;

the third connection auxiliary electrode;

the fourth connection auxiliary electrode; and an eighth connection auxiliary line connecting the fourth connection auxiliary electrode to the sixth connection auxiliary electrode.

* * * * *